US012792894B2

(12) United States Patent
Veluri et al.

(10) Patent No.: US 12,792,894 B2
(45) Date of Patent: Nov. 10, 2026

(54) PLANAR-STAGGERED ARRAY FOR DCNN ACCELERATORS

(71) Applicant: NATIONAL UNIVERSITY OF SINGAPORE, Singapore (SG)

(72) Inventors: Hasita Veluri, Singapore (SG); Voon Yew Aaron Thean, Singapore (SG); Yida Li, Singapore (SG); Baoshan Tang, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 691 days.

(21) Appl. No.: 18/256,532

(22) PCT Filed: Dec. 10, 2021

(86) PCT No.: PCT/SG2021/050778
§ 371 (c)(1),
(2) Date: Jun. 8, 2023

(87) PCT Pub. No.: WO2022/124993
PCT Pub. Date: Jun. 16, 2022

(65) Prior Publication Data
US 2024/0028880 A1 Jan. 25, 2024

(30) Foreign Application Priority Data
Dec. 11, 2020 (SG) ........................... 10202012419Q

(51) Int. Cl.
*G06N 3/063* (2023.01)
*G06N 3/0464* (2023.01)
*H10B 63/00* (2023.01)

(52) U.S. Cl.
CPC ........... *G06N 3/063* (2013.01); *G06N 3/0464* (2023.01); *H10B 63/80* (2023.02)

(58) Field of Classification Search
CPC ...... G06N 3/063; G06N 3/0464; G06N 3/045; G06N 3/048; G06N 3/065; H10B 63/80;
(Continued)

(56) References Cited

U.S. PATENT DOCUMENTS 5,864,496 A * 1/1999 Mueller ............... H10B 12/488 257/E21.651
9,928,907 B1 * 3/2018 Bandic ............... G11C 13/0069
(Continued)

FOREIGN PATENT DOCUMENTS

CN 106935258 A 7/2017
CN 111260048 A 6/2020
CN 111985602 A 11/2020

OTHER PUBLICATIONS

M. Mohammadi, A. Al-Fuqaha, S. Sorour, and M. Guizani, "Deep learning for IoT big data and streaming analytics: A survey," IEEE Commun. Surv. Tutorials, vol. 20, No. 4, pp. 2923-2960, 2018.
(Continued)

*Primary Examiner* — Khoi V Le
(74) *Attorney, Agent, or Firm* — Michael Best & Friedrich LLP

(57) ABSTRACT

A memory device for deep neural network, DNN, accelerators, a method of fabricating a memory device for deep neural network, DNN, accelerators, a method of convoluting a kernel [A] with an input feature map [B] in a memory device for a deep neural network, DNN, accelerator, a memory device for a deep neural network, DNN, accelerator, and a deep neural network, DNN, accelerator. The method of fabricating a memory device for deep neural network, DNN, accelerators comprises the steps of forming a first electrode layer comprising a plurality of bit-lines; forming a second electrode layer comprising a plurality of word-lines; and forming an array of memory elements disposed at respective cross-points between the plurality of (Continued)

word-lines and the plurality of bit-lines; wherein at least a portion of the bit-lines are staggered such that a location of a first cross-point between the bit-line and a first word-line is displaced along a direction of the word-lines compared to the cross-point between said bit-line and a second word-line adjacent the first word-line; or wherein at least a portion of the word-lines are staggered such that a location of a cross-point between the word-line and a first bit-line is displaced along a direction of the bit-lines compared to a cross-point between said word-line and a second bit-line adjacent the first bit-line.

20 Claims, 22 Drawing Sheets

(58) Field of Classification Search
CPC ......... G11C 13/004; G11C 11/54; G11C 7/18; G11C 8/14
See application file for complete search history.

(56) References Cited

U.S. PATENT DOCUMENTS

| | | | | |
|---|---|---|---|---|
| 2013/0339571 | A1* | 12/2013 | Cernea | G11C 7/18 711/102 |
| 2020/0175363 | A1* | 6/2020 | Lin | G06F 17/15 |
| 2023/0104314 | A1* | 4/2023 | Muzzetto | G11C 13/0004 257/5 |

OTHER PUBLICATIONS

M. A. Zidan, J. P. Strachan, and W. D. Lu, “The future of electronics based on memristive systems,” Nat. Electron., vol. 1, No. 1, pp. 22-29, 2018.
Z. Wang et al., “In situ training of feed-forward and recurrent convolutional memristor networks,” Nat. Mach. Intell., vol. 1, No. 9, pp. 434-442, Sep. 2019.
A. Ren et al., “SC-DCNN: Highly-scalable deep convolutional neural network using stochastic computing,” ACM SIGPLAN Not., vol. 52, No. 4, pp. 405-418, 2017.
D. B. Strukov, G. S. Snider, D. R. Stewart, and R. S. Williams, “The missing memristor found,” Nature, vol. 453, No. 7191, pp. 80-83, 2008.
Y. Chen et al., “DaDianNao: A Machine-Learning Supercomputer,” Proc. Annu. Int. Symp. Microarchitecture, MICRO, vol. 2015-Janua, No. January, pp. 609-622, 2015.
D. Ielmini and H. S. P. Wong, “In-memory computing with resistive switching devices,” Nature Electronics, vol. 1, No. 6. Nature Publishing Group, pp. 333-343, Jun. 1, 2018.
S. Tang et al., “AEPE: An area and power efficient RRAM crossbar-based accelerator for deep CNNs,” in NVMSA 2017—6th IEEE Non-Volatile Memory Systems and Applications Symposium, 2017.
S. Ambrogio et al., “Equivalent-accuracy accelerated neural-network training using analogue memory,” Nature, vol. 558, No. 7708, pp. 60-67, 2018.
A. Shafiee et al., “ISAAC: A Convolutional Neural Network Accelerator with In-Situ Analog Arithmetic in Crossbars,” in Proceedings—2016 43rd International Symposium on Computer Architecture, ISCA 2016, 2016, pp. 14-26.
L. Song, X. Qian, H. Li, and Y. Chen, “PipeLayer: A Pipelined ReRAM-Based Accelerator for Deep Learning,” in Proceedings—International Symposium on High-Performance Computer Architecture, 2017, pp. 541-552.
Z. Zhu et al., “Mixed size crossbar based RRAM CNN accelerator with overlapped mapping method,” IEEE/ACM Int. Conf. Comput. Des. Dig. Tech. Pap. ICCAD, pp. 1-8, 2018.
S. Ghodrati et al., “Mixed-Signal Charge-Domain Acceleration of Deep Neural Networks through Interleaved Bit-Partitioned Arithmetic,” in International Conference on Parallel Architectures and Compilation Techniques, 2020, pp. 399-411.
X. Qiao, X. Cao, H. Yang, L. Song, and H. Li, “AtomLayer: A universal ReRAM-based CNN accelerator with atomic layer computation,” Proc.—Des. Autom. Conf., vol. Part F1377, 2018.
M. Mao, X. Peng, R. Liu, J. Li, S. Yu, and C. Chakrabarti, “MAX2: ReRAM-Based Neural Network Accelerator That Maximizes Data Reuse and Area Utilization,” IEEE J. Emerg. Sel. Top. Circuits Syst., vol. 9, No. 2, pp. 398-410, 2019.
P. Lin et al., “Three-dimensional memristor circuits as complex neural networks,” Nat. Electron., vol. 3, No. 4, pp. 225-232, 2020.
H. Li et al., “Four-layer 3D vertical RRAM integrated with FinFET as a versatile computing unit for brain-inspired cognitive information processing,” Dig. Tech. Pap.—Symp. VLSI Technol., vol. 2016-Septe, pp. 1-2, 2016.
P. Chi et al., “Prime: A Novel Processing-in-Memory Architecture for Neural Network Computation in ReRAM-Based Main Memory,” in Proceedings—2016 43rd International Symposium on 11 Computer Architecture, ISCA 2016, 2016, pp. 27-39.
A. Chen and M. R. Lin, “Variability of resistive switching memories and its impact on crossbar array performance,” IEEE Int. Reliab. Phys. Symp. Proc., p. MY.7.1-MY.7.4, 2011.
Y. F. Kao, W. C. Zhuang, C. J. Lin, and Y. C. King, “A Study of the Variability in Contact Resistive Random Access Memory by Stochastic Vacancy Model,” Nanoscale Res. Lett., vol. 13, 2018.
B. Chakrabarti et al., “A multiply-add engine with monolithically integrated 3D memristor crossbar/CMOS hybrid circuit,” Sci. Rep., vol. 7, No. Sep. 2016, pp. 1-10, 2017.
S. Agarwal et al., “Resistive memory device requirements for a neural algorithm accelerator,” Proc. Int. Jt. Conf. Neural Networks, vol. 2016-Octob, pp. 929-938, 2016.
L. Xia et al., “Technological Exploration of RRAM Crossbar Array for Matrix-Vector Multiplication,” J. Comput. Sci. Technol., vol. 31, No. 1, pp. 3-19, 2016.
Y. LeCun and C. Cortes, “MNIST handwritten digit database,” AT&T Labs [Online]. Available: http://yann. lecun. com/exdb/mnist. 2010.
A. Krizhevsky, I. Sutskever, and G. Hinton, “Imagenet classification with deep convolutional neural networks,” in Conference on Neural Information Processing Systems, 2012.
K. Simonyan and A. Zisserman, “Very deep convolutional networks for large-scale image recognition,” 3rd Int. Conf. Learn. Represent. ICLR 2015—Conf. Track Proc., pp. 1-14, 2015.
K. He, X. Zhang, S. Ren, and J. Sun, “Deep residual learning for image recognition,” Proc. IEEE Comput. Soc. Conf. Comput. Vis. Pattern Recognit., vol. 2016-Decem, pp. 770-778, 2016.
E. Lehtonen and M. Laiho, “CNN using memristors for neighborhood connections,” in 2010 12th International Workshop on Cellular Nanoscale Networks and their Applications, CNNA 2010, 2010.
C. S. Lee, B. Cline, S. Sinha, G. Yeric, and H. S. P. Wong, “32-bit Processor core at 5-nm technology: Analysis of transistor and interconnect impact on VLSI system performance,” Tech. Dig.—Int. Electron Devices Meet. IEDM, pp. 28.3.1-28.3.4, 2017.
ITRS, “2007 ITRS Interconnect,” 2007.
A. A. Vyas, C. Zhou, and C. Y. Yang, “On-Chip Interconnect Conductor Materials for End-of-Roadmap Technology Nodes,” IEEE Trans. Nanotechnol., vol. 17, No. 1, pp. 4-10, 2018.
A. Mallik et al., “Design-technology co-optimization for OxRRAM-based synaptic processing unit,” in Digest of Technical Papers—Symposium on VLSI Technology, 2017, pp. T178-T179.
M. Hu et al., “Dot-product engine for neuromorphic computing: Programming 1T1M crossbar to accelerate matrix-vector multiplication,” in Proceedings—Design Automation Conference, 2016, vol. 05-09-June.
J. Sauerbrey, D. Schmitt-Landsiedel, and R. Thewes, “A 0.5-V 1-μ W successive approximation ADC,” IEEE J. Solid-State Circuits, vol. 38, No. 7, pp. 1261-1265, 2003.
L. Kull et al., “A 3.1mW 8b 1.2GS/s single-channel asynchronous SAR ADC with alternate comparators for enhanced speed in 32nm digital SOI CMOS,” Dig. Tech. Pap.—IEEE Int. Solid-State Circuits Conf., vol. 56, pp. 468-469, 2013.
M. Saberi, R. Lotfi, K. Mafinezhad, and W. A. Serdijn, “Analysis of power consumption and linearity in capacitive digital-to-analog

(56) References Cited

OTHER PUBLICATIONS converters used in successive approximation ADCs," IEEE Trans. Circuits Syst. I Regul. Pap., vol. 58, No. 8, pp. 1736-1748, 2011.
L. Kull et al., "A 10b 1.5GS/s pipelined-SAR ADC with background second-stage common-mode regulation and offset calibration in 14nm CMOS FinFET," Dig. Tech. Pap.—IEEE Int. Solid-State Circuits Conf., vol. 60, pp. 474-475, 2017.
P. Pouyan, E. Amat, and A. Rubio, "Reliability challenges in design of memristive memories," in 2014 5th European Workshop on CMOS Variability, VARI 2014, 2014. [39] B. H. P. Wong et al., "Metal—Oxide RRAM," Proc. IEEE, vol. 20, No. 6, pp. 1951-1970, 2012.
M. Hu et al., "Memristor-Based Analog Computation and Neural Network Classification with a Dot Product Engine," Adv. Mater., vol. 30, No. 9, p. 1705914, Mar. 2018.
H. Veluri, Y. Li, J. X. Niu, E. Zamburg, and A. V. Y. Thean, "High Throughput, Area-Efficient, and Variation-Tolerant 3D In-memory Compute System for Deep Convolutional Neural Networks," IEEE Internet Things J., vol. 4662, No. c, pp. 1-15, 2021.
D. Ielmini, "Resistive switching memories based on metal oxides: Mechanisms, reliability and scaling," Semiconductor Science and Technology, vol. 31, No. 6. Institute of Physics Publishing, May 16, 2016.
B. Chen, F. Cai, J. Zhou, W. Ma, P. Sheridan, and W. D. Lu, "Efficient in-memory computing architecture based on crossbar arrays," in Technical Digest—International Electron Devices Meeting, IEDM, 2015, vol. 2016-Febru, pp. 17.5.1-17.5.4.
C.-Y. Lin, C.-Y. Wu, C.-Y. Wu, C. Hu, and T.-Y. Tseng, "Bistable Resistive Switching in Al[sub 2]O[sub 3] Memory Thin Films," J. Electrochem. Soc., vol. 154, No. 9, p. G189, 2007.
C. Chang, W. Chen, and Y. Chih, "An N40 256K×44 Embedded RRAM Macro with SL-Precharge SA and Low-Voltage Current Limiter to Improve Read and Write Performance," IEEE Int. Solid—State Circuits Conf., pp. 478-478, 2018.
P. Jain et al., "A 13.2 A 3.6Mb 10.1Mb/mm2 Embedded Non-Volatile ReRAM Macro in 22nm FinFET Technology with Adaptive Forming/Set/Reset Schemes Yielding Down to 0.5V with Sensing Time of 5ns at 0.7V," IEEE Int. Solid-State Circuits Conf., pp. 212-214, 2019.
V. V. Zhirnov, R. Meade, R. K. Cavin, and G. Sandhu, "Scaling limits of resistive memories," Nanotechnology, vol. 22, No. 25, 2011.
N. Muralimanohar, R. Balasubramonian, and N. Jouppi, "Optimizing NUCA organizations and wiring alternatives for large caches with CACTI 6.0," Proc. Annu. Int. Symp. Microarchitecture, MICRO, pp. 3-14, 2007.
Veluri, H. et al., "A Low-Power DNN Accelerator Enabled by a Novel Staircase RRAM Array," IEEE Transactions on Nerural Networks and Learning Systems, Oct. 20, 2021, pp. 1-12.
B. H. P. Wong et al., "Metal—Oxide RRAM," Proc. IEEE, vol. 20, No. 6, pp. 1951-1970, 2012.

* cited by examiner

TI: Tile
MP: Max-Pool
RU: ReLU Unit
SU: Softmax Unit
XB: Crossbar array
OR:O/P Register
A: Adder
M: Multiplier
IR: I/P Register
PU/PMU: Pulse Matrix Unit
AR: Array

| *NN* | *Layer Weights* | *This Work* | *GPU* |
|---|---|---|---|
| 1 CN+ 1 FC+ 1 SM | CN: (7×7, 5, 1) FC: 30×605 SM: 10×30 | 98.01 | 98.05 |
| 2 CN+ 1 FC+ 1 SM | $CN^1$: (5×5, 20, 1) $CN^2$: (5×5, 40, 20) FC: 100×640 SM: 10×100 | 99.27 | 99.32 |

PLANAR-STAGGERED ARRAY FOR DCNN ACCELERATORS

CROSS REFERENCE TO RELATED APPLICATIONS

This application is a national stage filing under 35 U.S.C. § 371 of International Patent Application No.: PCT/SG2021/050778, filed Dec. 10, 2021, which claims priority to Singapore Patent Application No. 10202012419Q, filed Dec. 11, 2020, the entire contents of all of which are hereby incorporated by reference herein.

FIELD OF INVENTION

The present invention relates broadly to a memory device for deep neural network, DNN, accelerators, a method of fabricating a memory device for deep neural network, DNN, accelerators, a method of convoluting a kernel [A] with an input feature map [B] in a memory device for a deep neural network, DNN, accelerator, a memory device for a deep neural network, DNN, accelerator, and a deep neural network, DNN, accelerator; specifically to the development of an architecture for efficient execution of convolution in Deep convolutional neural networks.

BACKGROUND

Any mention and/or discussion of prior art throughout the specification should not be considered, in any way, as an admission that this prior art is well known or forms part of common general knowledge in the field.

The recent advances in low-power Deep Neural Network (DNN) accelerators provide a pathway to infuse the connected devices with the required communication and computational capabilities to revolutionize our interactions with the physical world. As untethered computing using DNNs at the edge of IoT is limited by the power source, the power-hungry high performance servers required by GPU/ASIC-based DNNs act as the deterrent to their wide spread deployment. This bottleneck motivates the investigation of more efficient but specialized devices and architectures.

Resistive Random-Access Memories (RRAMs) are memory devices capable of continuous non-volatile conductance states. By leveraging the RRAM crossbar's ability to perform parallel in-memory multiply-and-accumulate computations, one can build compact, high-speed DNN processors. However, convolution execution (FIG. 1(*a*)) and simultaneous output feature map generation using planar crossbar arrays with the Manhattan layout (FIG. 1(*b*)) require unfolding input matrices into vectors and massive input regeneration, both of which lead to increased power and area consumption.

Current state-of-the-art RRAM array-based DNN accelerators overcome the above issues and enhance performance by combining the RRAM with multiple architectural optimizations. For example, one existing RRAM array-based DNN accelerator improves system throughput using an interlayer pipeline but could lead to pipeline bubbles and high latency. Another existing RRAM array-based DNN accelerator employs layer-by-layer output computation and parallel multi-image processing to eliminate dependencies, yet it increases the buffer sizes. Another existing RRAM array-based DNN accelerator increases input reuse by engaging register chain and buffer ladders in different layers, but increases bandwidth burden. Using a multi-tiled architecture where each tile computes partial sums in a pipelined fashion also increases input reuse. Another existing RRAM array-based DNN accelerator employs bidirectional connections between processing elements to maximize input reuse while minimizing interconnect cost. Another existing RRAM array-based DNN accelerator maps multiple filters onto a single array and reorders inputs, outputs to generate outputs parallelly. Other existing RRAM array-based DNN accelerators exploit the third dimension to build 3D-arrays for performance enhancements.

However, the system-level enhancements that most reported works employ result in hardware complexities. The differential technique (FIG. 1(*b*)) that they utilize for signed floating-point computations, and usage of a 16-bit input resolution impede significant throughput improvement and power reduction owing to increased clock cycles and interface accesses. Typical 3D-RRAM implementations using though-silicon vias (TSVs) face similar image unfolding and regeneration issues. Though 3D-arrays with staircase routing (Staggered-3D) improve throughput, they suffer from high via-resistance that limits the number of RRAM layers and increases peripheral circuitry. Besides, the intrinsic analog nature of computations within crossbar arrays renders them highly susceptible to the parasitic I-R drop and the RRAM's current nonlinearity, limited conductance range. Thus, there is a need for layout optimizations and a hardware-aware in-memory compute methodology to overcome the mentioned weaknesses and circuit overheads.

Embodiments of the present invention seek to address at least one of the above needs.

SUMMARY

In accordance with a first aspect of the present invention, there is provided a memory device for deep neural network, DNN, accelerators, the memory device comprising:

- a first electrode layer comprising a plurality of bit-lines;
- a second electrode layer comprising a plurality of word-lines; and
- an array of memory elements disposed at respective cross-points between the plurality of word-lines and the plurality of bit-lines;
- wherein at least a portion of the bit-lines are staggered such that a location of a cross-point between the bit-line and a first word-line is displaced along a direction of the word-lines compared to a cross-point between said bit-line and a second word-line adjacent the first word-line; or
- wherein at least a portion of the word-lines are staggered such that a location of a cross-point between the word-line and a first bit-line is displaced along a direction of the bit-lines compared to a cross-point between said word-line and a second bit-line adjacent the first bit-line.

In accordance with a second aspect of the present invention, there is provided a method of fabricating a memory device for deep neural network, DNN, accelerators, the method comprising the steps of:

- forming a first electrode layer comprising a plurality of bit-lines;
- forming a second electrode layer comprising a plurality of word-lines; and
- forming an array of memory elements disposed at respective cross-points between the plurality of word-lines and the plurality of bit-lines;
- wherein at least a portion of the bit-lines are staggered such that a location of a first cross-point between the bit-line and a first word-line is displaced along a direction of the word-lines compared to the cross-point between said bit-line and a second word-line adjacent the first word-line; or wherein at least a portion of the word-lines are staggered such that a location of a cross-point between the word-line and a first bit-line is displaced along a direction of the bit-lines compared to a cross-point between said word-line and a second bit-line adjacent the first bit-line In accordance with a third aspect of the present invention, there is provided a method of convoluting a kernel [A] with an input feature map [B] in a memory device for a deep neural network, DNN, accelerator, comprising the steps of:

transforming the kernel using $[A]_{a\times b}=[A_1]_{a\times b}+(\text{sign}(\min([A]))\times[U_1]_{a\times b})$;

transforming the feature map using $[B]_{n\times t}=[B_1]_{n\times t}+(\text{sign}(\min([B]))\times[U_2]_{n\times t})$;

splitting $[A_1]$ using $$M_{1,ij} = \begin{cases} 0; \text{ if } A_{1,ij} < X \\ A_{1,ij} - X; \text{ if } A_{1,ij} \geq X \end{cases};$$

$$0 < X < \max([A_1]) \text{ and } [M_2] = [A_1] - [M_1];$$

splitting $[U_1]$ using $$\begin{aligned} M_{3,ij} &= 0 \\ M_{4,ij} &= \text{abs}(\min([A])) \end{aligned};$$

performing a state transformation on $[M_1]$, $[M_2]$, $[M_3]$, and $[M_4]$ to generate memory device conductance state matrices to be used to program memory elements of the memory device; and using $[B_1]$ and $[U_2]$ to determine respective pulse widths matrices to be applied to word-lines/bit-lines of the memory device.

In accordance with a fourth aspect of the present invention, there is provided a memory device for a deep neural network, DNN, accelerator configured for executing the method of the third aspect.

In accordance with a fifth aspect of the present invention, there is provided a deep neural network, DNN, accelerator comprising a memory device of first or fourth aspects.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 1(*b*) shows a schematic drawing illustrating typical in-memory convolution execution within planar arrays using differential technique that requires matrix unfolding and input regeneration.

FIG. 1(*c*) shows a schematic drawing illustrating a planar-staircase array that inherently shifts inputs, reduces input regeneration and parallelizes output generation, according to an example embodiment.

FIG. 1(*d*) shows a schematic drawing illustrating the architecture of an accelerator with pipelining [9], Ex-IO IF: External IO interface.

FIG. 1(*e*) shows a flowchart illustrating an in-memory compute methodology according to an example embodiment, ST: State Transformation.

FIG. 1(*f*) shows a schematic drawing illustrating the procedure for the in-memory M2M methodology for neural networks, according to an example embodiment. Black boxes represent the matrix stored within arrays, the gray boxes represent the matrix applied as input pulses.

FIG. 2(*b*) shows the DC curve of planar-staircase $Al_2O_3$ RRAM devices according to example embodiments, over 50 cycles.

FIG. 2(*c*) shows the cumulative probability distribution of set and reset voltages for 15 devices according to example embodiment, over 50 cycles, showing a tight distribution, D2D: Device-to-Device, C2C: Cycle-to-Cycle.

FIG. 2(*d*) shows 5× linear conductance modulation of 15 RRAM devices according to example embodiment, over 100 reset pulses with low D2D variability (bars), where Current Compliance (CC)=1 mA.

FIG. 2(*e*) shows a comparison of a developed spice model with experimental data, showing good correlation according to example embodiments.

FIG. 3(*b*) relates to RRAM array according to an example embodiment parasitic evaluation, where technology node: 40 nm, $V_{read}$=0.1V, and the array is assumed to have copper routes, specifically the effect of via and line parasitic resistance on the current flowing through staircase array outputs as a function of kernel size and outputs/AS, #AS: Kernel_columns, Total outputs from the array=#AS×(Outputs/AS).

FIG. 3(*c*) relates to RRAM array according to an example embodiment parasitic evaluation, where technology node: 40 nm, $V_{read}$=0.1V, and the array is assumed to have copper routes, specifically worst case current flowing through array outputs as a function of #AS, Outputs/AS=26.

FIG. 3(*d*) relates to RRAM array according to an example embodiment parasitic evaluation, where technology node: 40 nm, $V_{read}$=0.1V, and the array is assumed to have copper routes, specifically line delay as a function of #AS, Outputs/AS=26.

FIG. 3(*e*) relates to RRAM array according to an example embodiment parasitic evaluation, where technology node: 40 nm, $V_{read}$=0.1V, and the array is assumed to have copper routes, specifically worst case current as a function of Kernel size for different layouts.

FIG. 4(*b*) relates to M2M evaluation according to an example embodiment, where $RRAM_{res}=\log_2(RRAM_{states})$, $Pulse_{res}=\log_2(Pulse_{levels})$, ES: Encoding Scheme, x: number of times a matrix has been split, Ux/Sx: unsigned/signed floating-point matrix convolution, specifically OE for floating-point matrix convolution as a function of input pulse levels for $RRAM_{res}$=1b, 6b.

FIG. 4(*c*) relates to M2M evaluation according to an example embodiment, where $RRAM_{res}=\log_2(RRAM_{states})$, $Pulse_{res}=\log_2(Pulse_{levels})$, ES: Encoding Scheme, x: number of times a matrix has been split, Ux/Sx: unsigned/signed floating-point matrix convolution, specifically OE as function of X. X=f×max([Z]); [Z] is the matrix being split, f=0.25/0.5/0.75.

FIG. 4(*d*) relates to M2M evaluation according to an example embodiment, where $RRAM_{res}=\log_2(RRAM_{states})$, $Pulse_{res}=\log_2(Pulse_{levels})$, ES: Encoding Scheme, x: number of times a matrix has been split, Ux/Sx: unsigned/signed floating-point matrix convolution, specifically $ADC_{res}$ as a function of $RRAM_{res}$ and contributing inputs, $Pulse_{res}$=3/6.

FIG. 4(*e*) relates to M2M evaluation according to an example embodiment, where $RRAM_{res}=\log_2(RRAM_{states})$, $Pulse_{res}=\log_2(Pulse_{levels})$, ES: Encoding Scheme, x: number of times a matrix has been split, Ux/Sx: unsigned/signed floating-point matrix convolution, specifically $ADC_{res}$ as a function of $RRAM_{res}$ and contributing inputs, $Pulse_{res}$=3/6.

FIG. 4(*f*) relates to M2M evaluation according to an example embodiment, where $RRAM_{res}=\log_2(RRAM_{states})$, $Pulse_{res}=\log_2(Pulse_{levels})$, ES: Encoding Scheme, x: number of times a matrix has been split, Ux/Sx: unsigned/signed floating-point matrix convolution, specifically System Power consumed by planar staircase arrays per convolution as a function of ES, ES: $RRAM_{res}$–$Pulse_{res}$.

FIG. 4(*g*) relates to M2M evaluation according to an example embodiment, where $RRAM_{res}=\log_2(RRAM_{states})$, $Pulse_{res}=\log_2(Pulse_{levels})$, ES: Encoding Scheme, x: number of times a matrix has been split, Ux/Sx: unsigned/signed floating-point matrix convolution, specifically comparison of power per convolution for various ES with OE<5%, ES: Sx–$RRAM_{res}$–$Pulse_{res}$.

FIG. 5(*b*) shows MNIST [23] Classification accuracy for a method according to an example embodiment vs GPU for a 3-layer DCNN with floating-point numbers for different encoding schemes.

FIG. 5(*c*) shows MNIST [23] Classification Accuracy comparison between S1_4_3 scheme according to an example embodiment & GPU for different DCNNs (a 3-layer CNN and a 4-layer CNN), CN: Convolutional Layer; FC: Fully connected Layer; SM: Softmax Layer.

FIG. 6(*b*) shows the S1_4_3 ES analysis, specifically area required by the staircase array according to an example embodiment as a function of Outputs/AS, #AS=26.

FIG. 6(*c*) shows the S1_4_3 ES analysis, specifically power consumed by the staircase array according to an example embodiment as a function of #AS.

FIG. 6(*d*) shows the S1_4_3 ES analysis, specifically area required by the staircase array according to an example embodiment as a function of #AS.

FIG. 6(*e*) shows the S1_4_3 ES analysis, specifically a comparison of power consumed by different layouts for the parallel output generation of a 28×28 image convolution with kernels, according to an example embodiment.

FIG. 6(*f*) shows the S1_4_3 ES analysis, specifically a comparison of area consumed by different layouts for the parallel output generation of a 28×28 image convolution with kernels, according to an example embodiment.

DETAILED DESCRIPTION

Figure 1A:
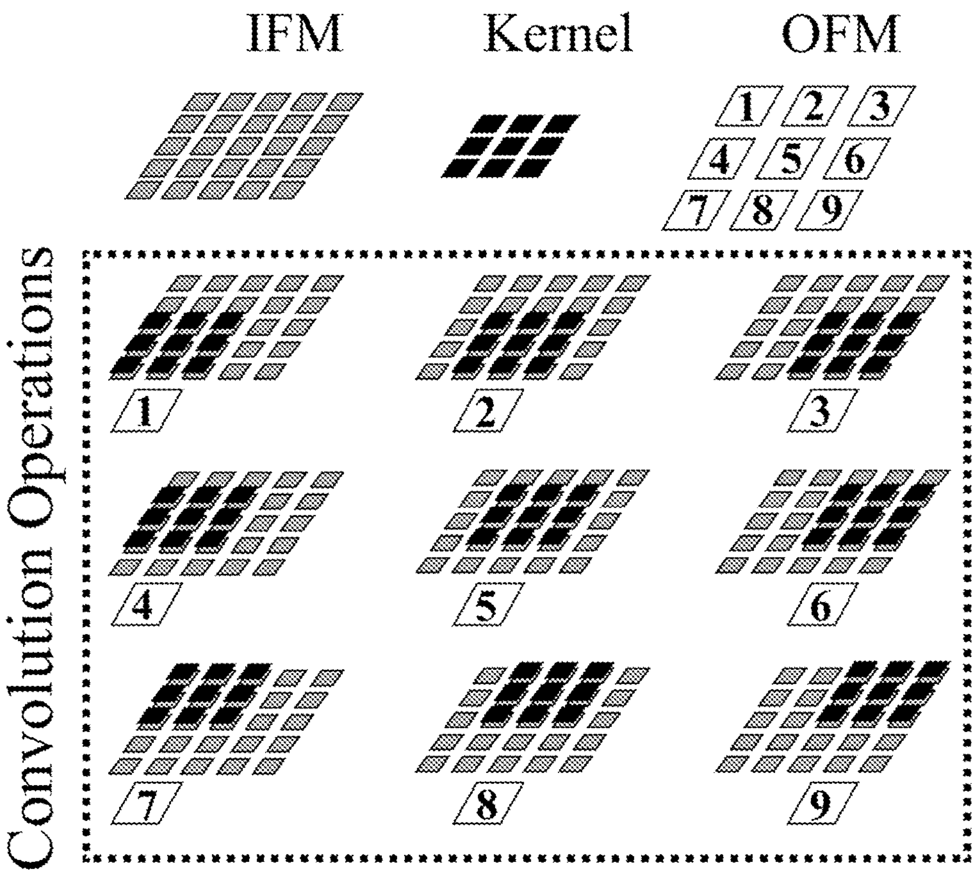
FIG. 1(*a*) shows a schematic drawing illustrating operations involved in the convolution of a kernel with an input image.
Figure 1B:
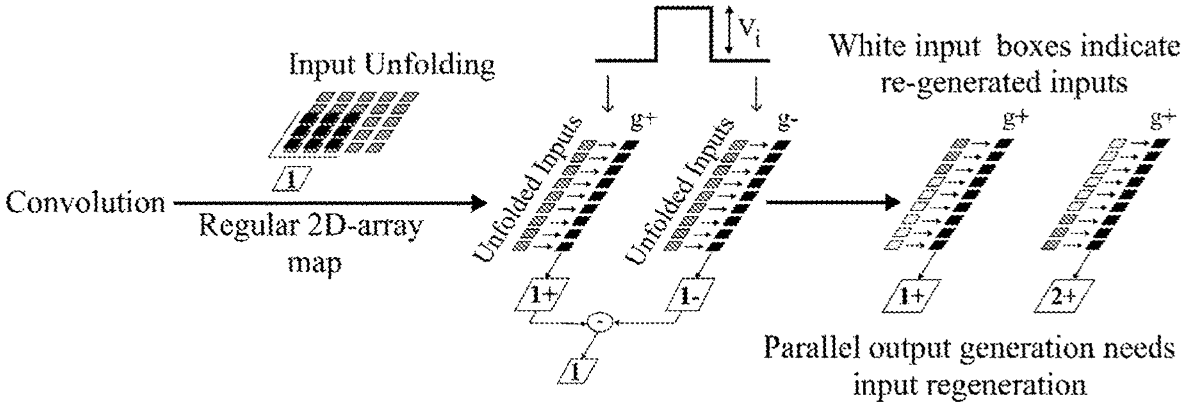
Figure 1C:
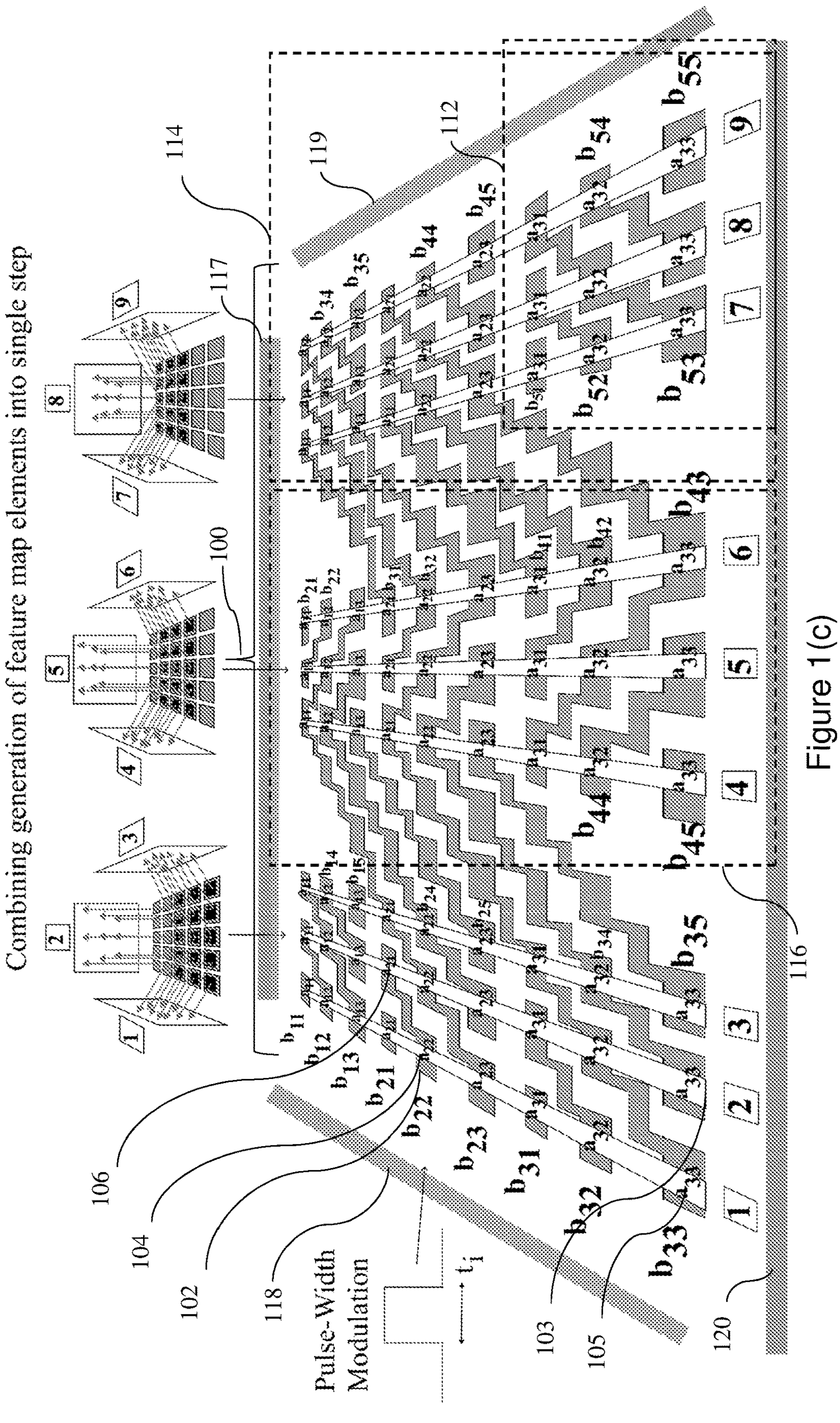
Figure 1D:
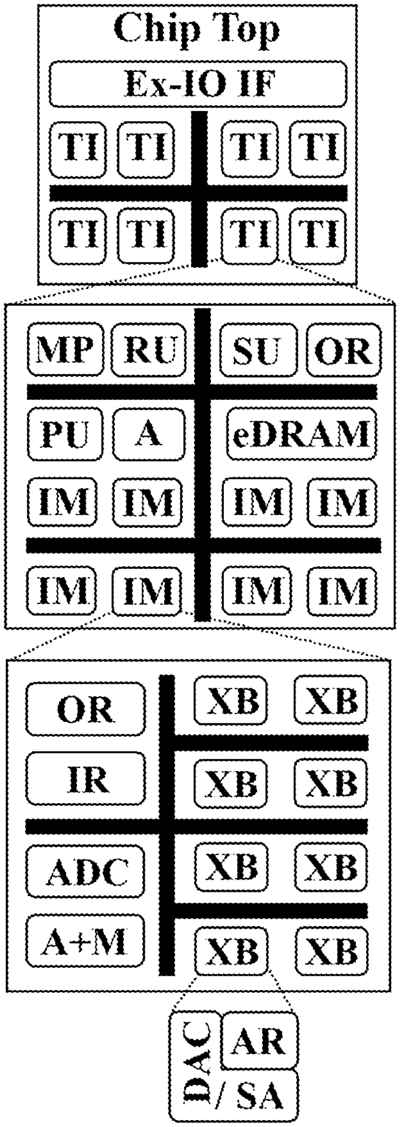
Figure 1E:
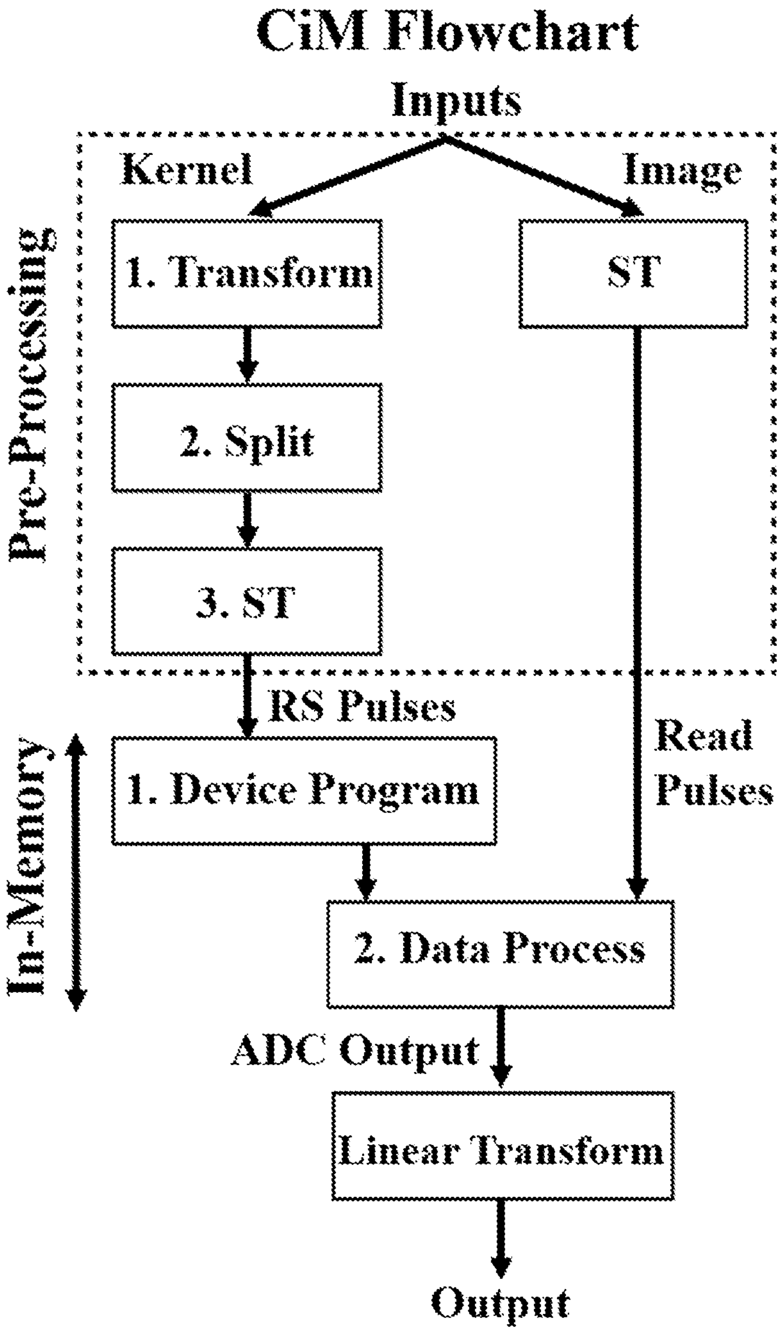
Figure 1F:
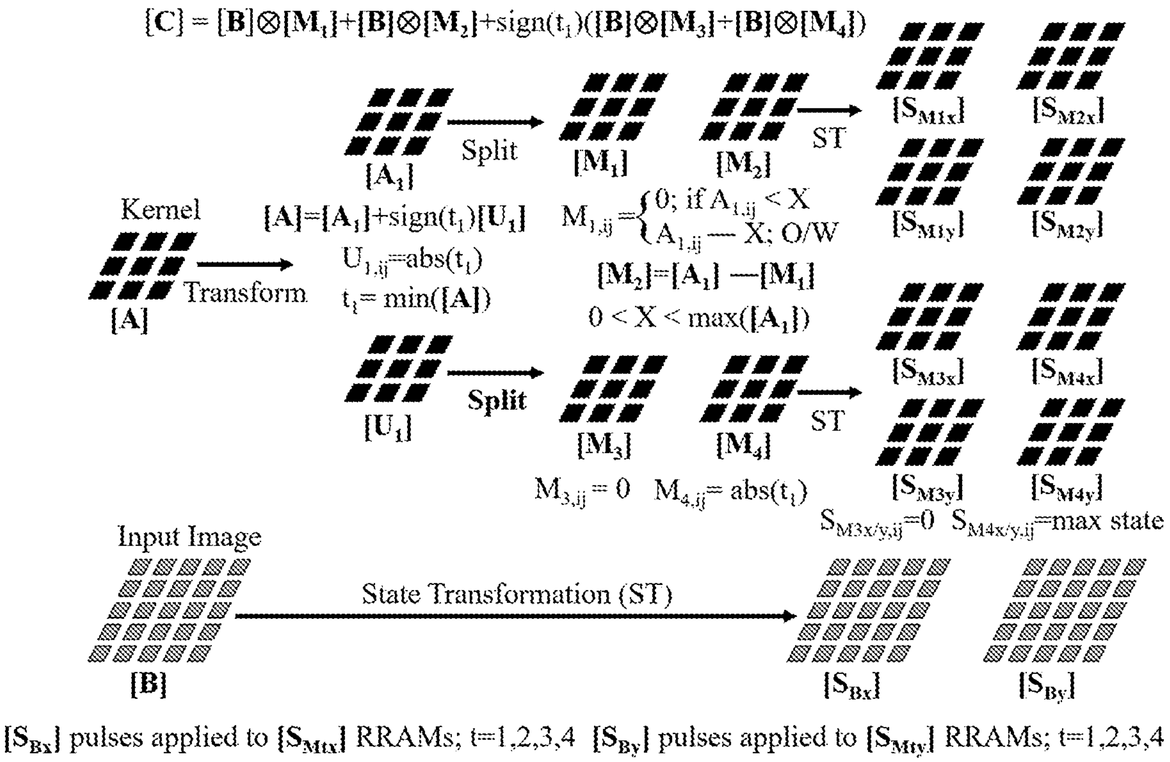
Figure 2A:
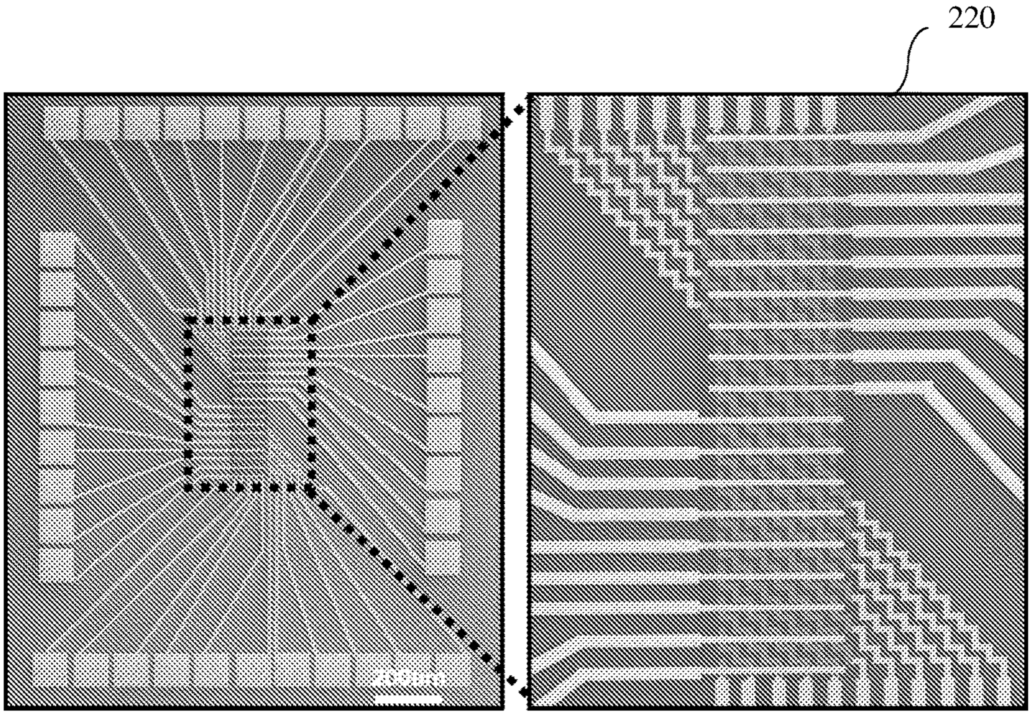
FIG. 2(*a*) shows an SEM image of a fabricated sub-array for a 5×5 Kernel with 22 inputs and 18 outputs, according to an example embodiment.
Figure 2B:
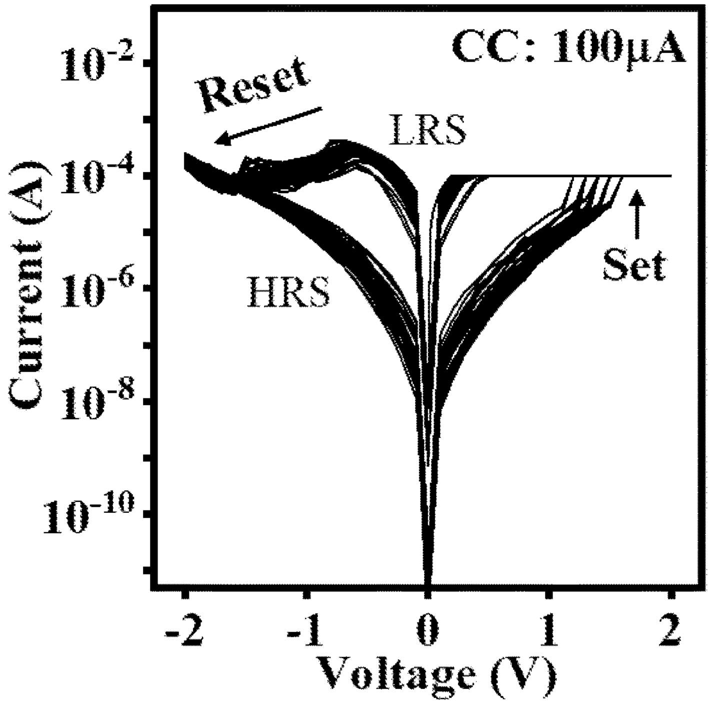
Figure 2C:
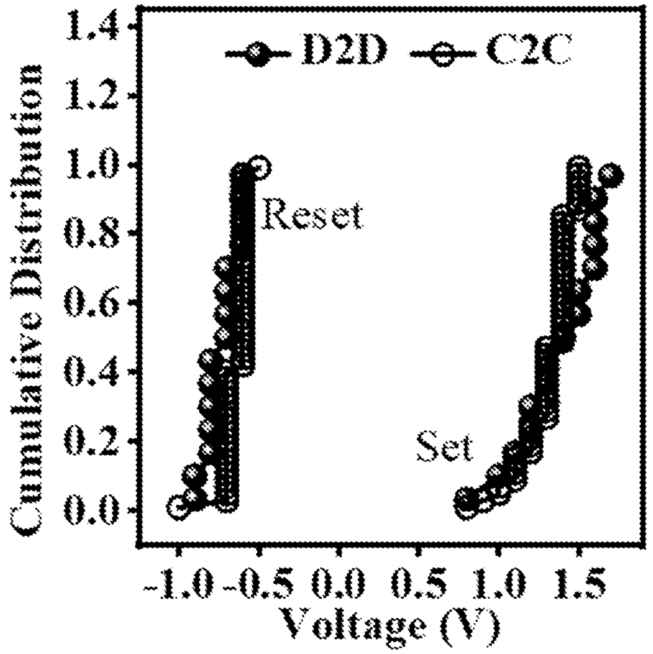
Figure 2D:
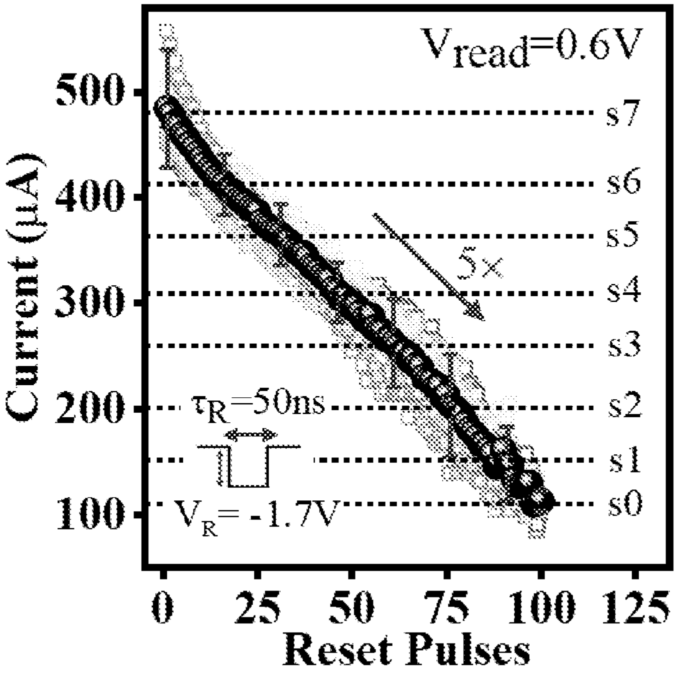
Figure 2E:
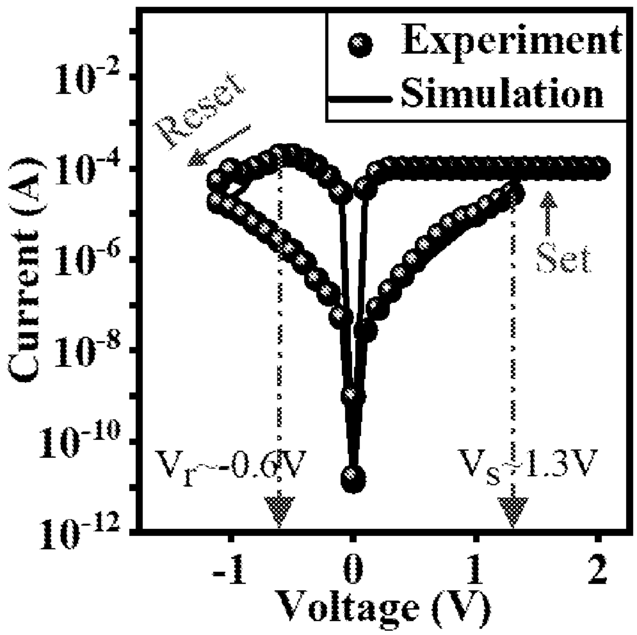
Figure 3A:
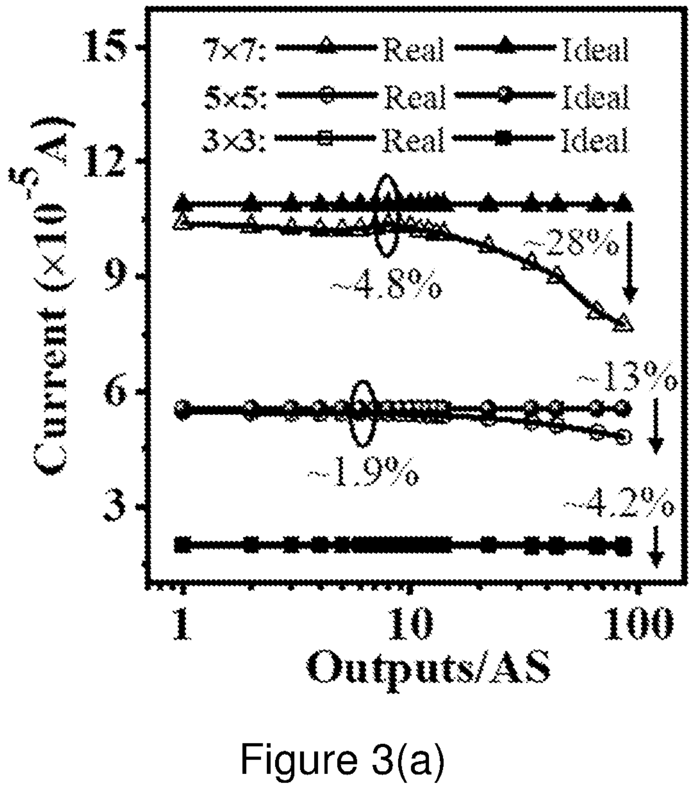
FIG. 3(*a*) relates to RRAM array according to an example embodiment parasitic evaluation, where technology node: 40 nm, $V_{read}$=0.1V, and the array is assumed to have copper routes, specifically the effect of via and line parasitic resistance on the current flowing through staircase array outputs as a function of kernel size and outputs/AS, #AS: Kernel_columns, Total outputs from the array=#AS×(Outputs/AS).
Figure 3B:
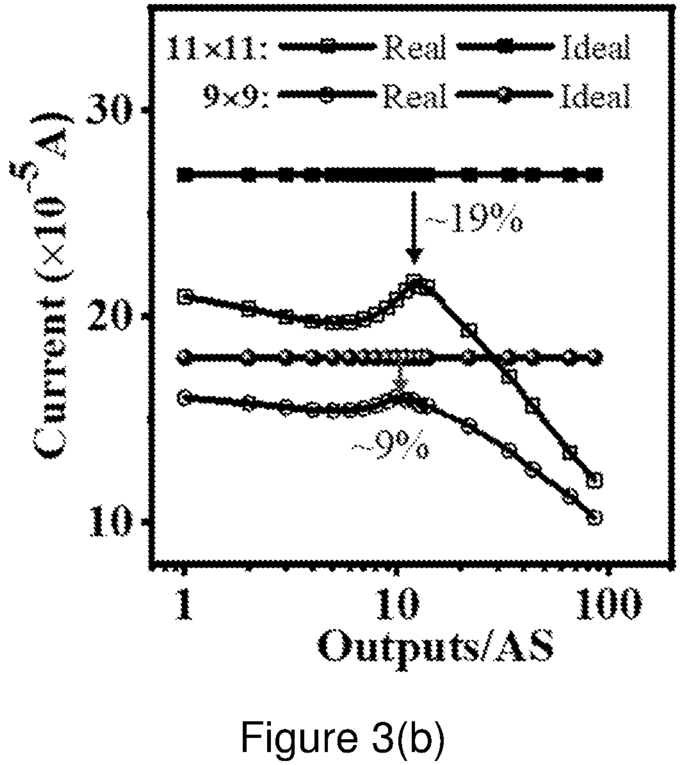
Figure 3C:
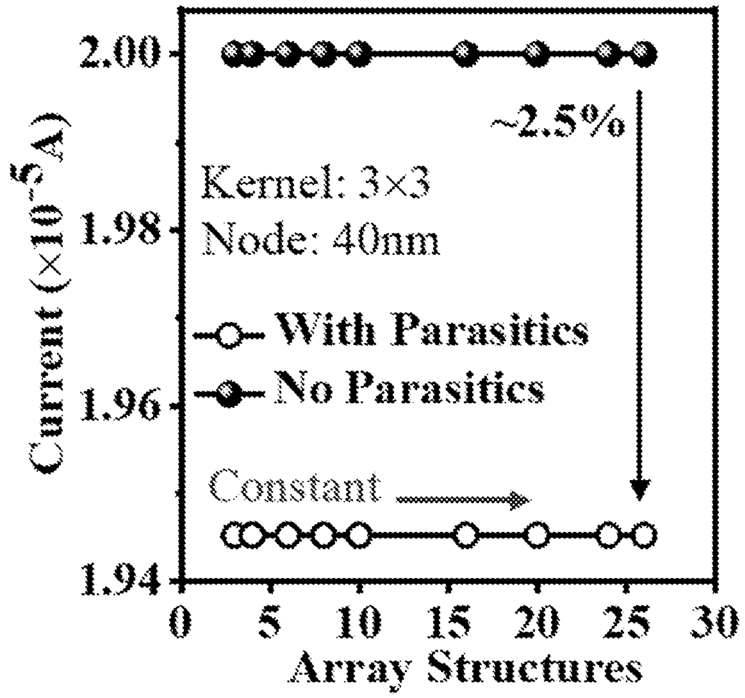
Figure 3D:
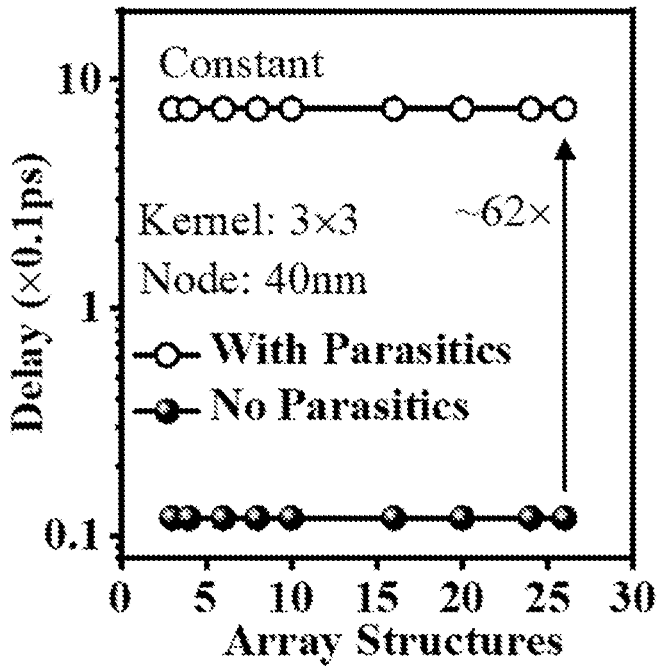
Figure 3E:
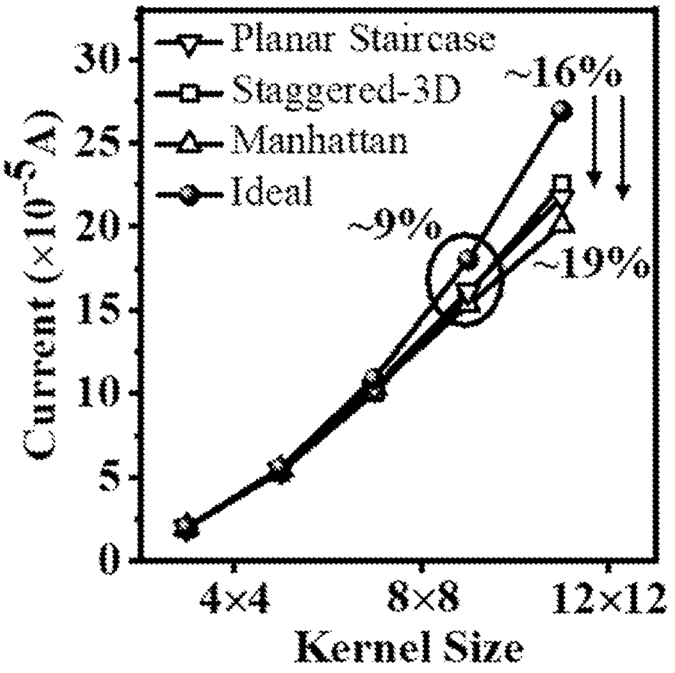
Figure 4A:
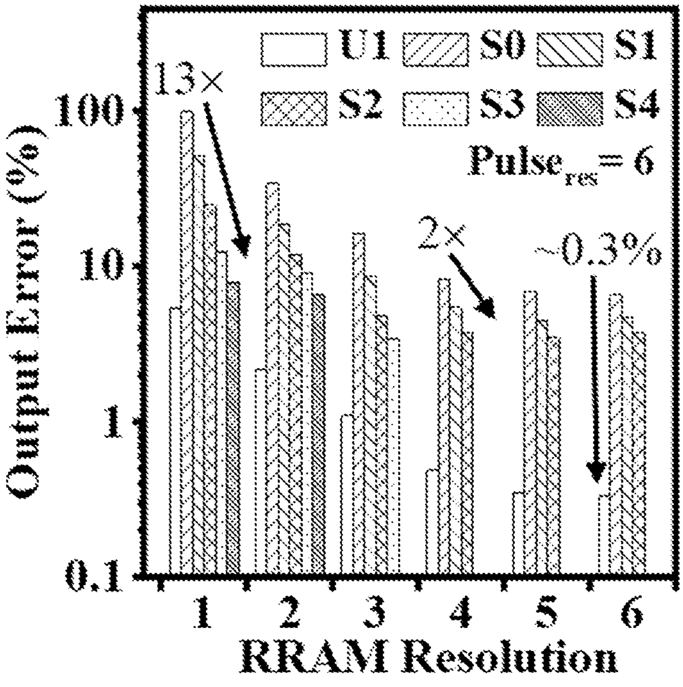
FIG. 4(*a*) relates to M2M evaluation according to an example embodiment, where $RRAM_{res}=\log_2(RRAM_{states})$, $Pulse_{res}=\log_2(Pulse_{levels})$, ES: Encoding Scheme, x: number of times a matrix has been split, Ux/Sx: unsigned/signed floating-point matrix convolution, specifically output error (OE) for floating-point matrix convolution as a function of RRAM resolution.
Figure 4B:
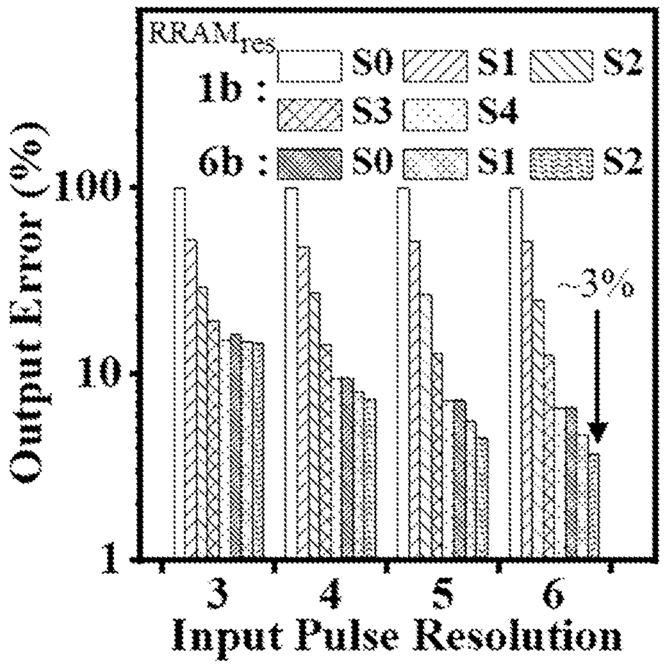
Figure 4C:
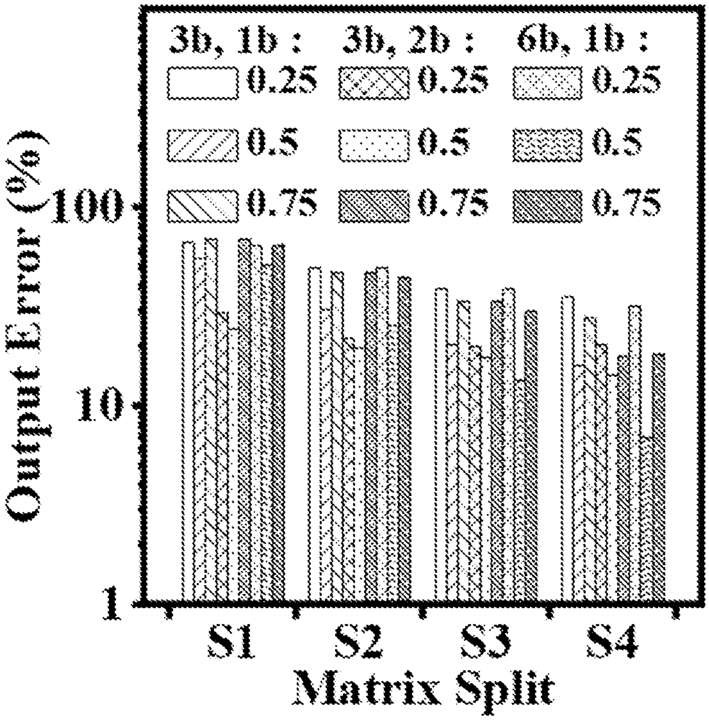
Figure 4D:
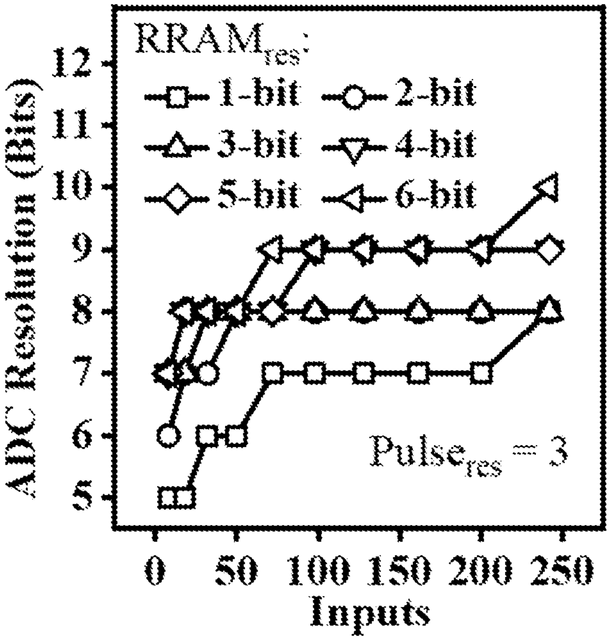
Figure 4E:
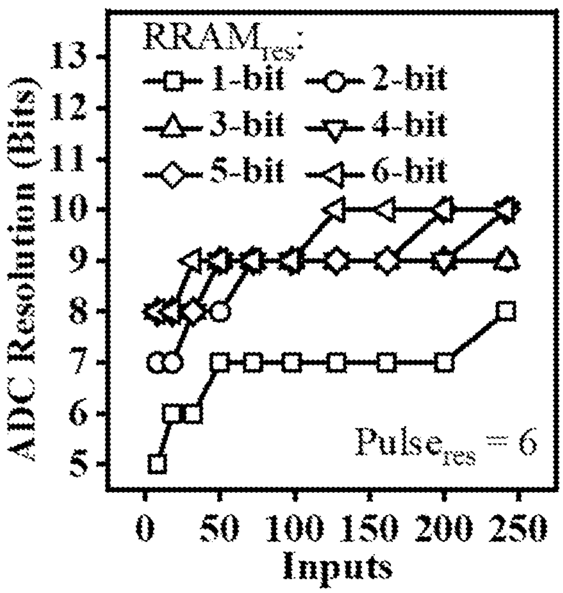
Figure 4F:
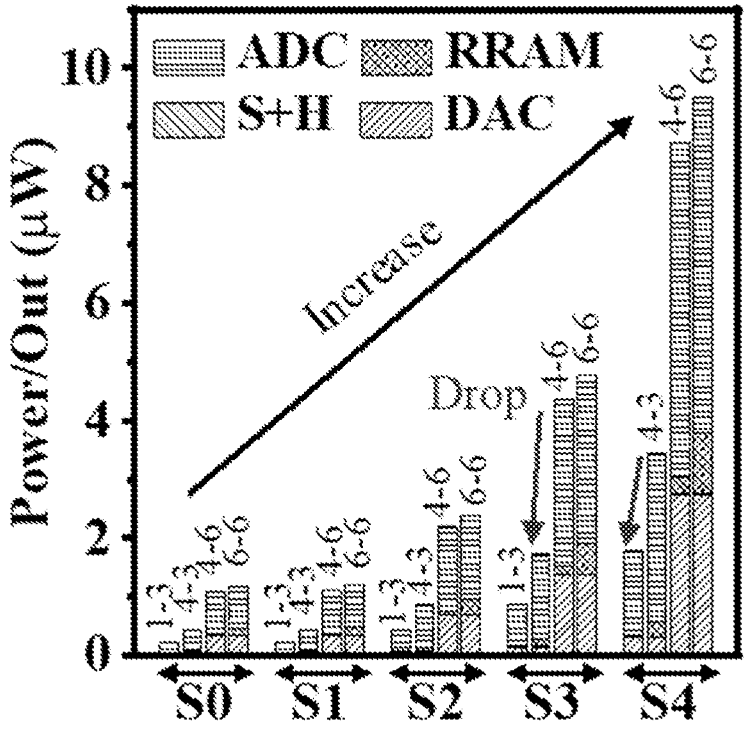
Figure 4G:
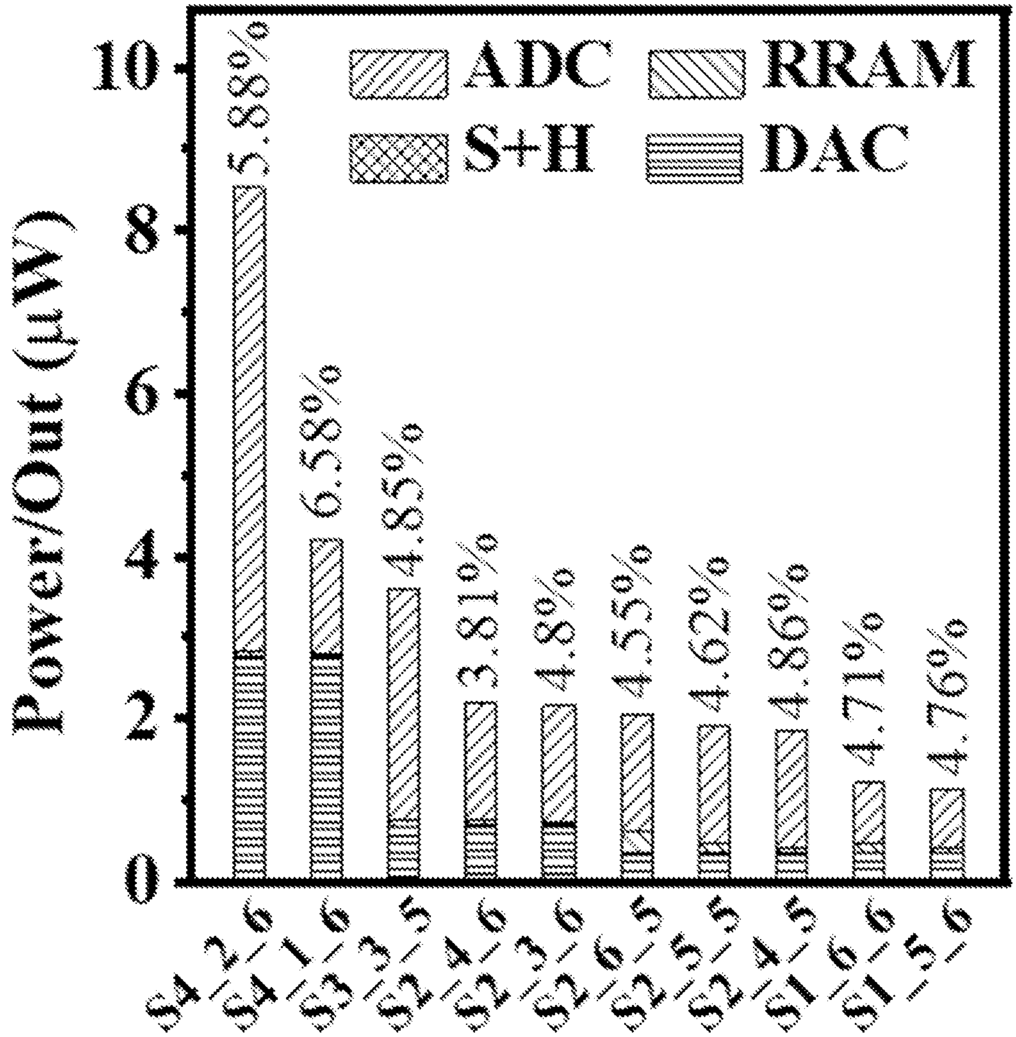

In an example embodiment, a hardware-aware co-designed system is provided that combats the above-mentioned issues and improves performance, with the following contributions:

- A planar-staircase array according to an example embodiment (FIG. 1(*c*)).
- Combining the novel planar-staircase array (FIG. 1(*c*)) with a hardware-aware in-memory compute method to design an accelerator (FIG. 1(*d*)) that enhances peak power-efficiency.
- By reducing the number of devices connected to each input, the planar-staircase RRAM array according to an example embodiment alleviates I-R drop and sneak current issues to enable an exponential increase in crossbar array size compared to Manhattan arrays. The layout can be further extended to other emerging memories such as CBRAMs, PCMs.
- Eliminate input unfolding and reduce regeneration by performing convolutions through voltage application at the staircase-routed bottom electrodes and current collection from the top electrodes (FIG. 1(*c*)). Power can be reduced by ~68% and area by ~73% per convolution output generation, compared to a Manhattan array execution.
- An in-memory Matrix-Matrix multiplication (M2M) method according to an example embodiment (FIGS. 1(*e*) and (*f*)) accounts for device and circuit issues to map arbitrary floating-point matrix values to finite RRAM conductances and can effectively combat device variability and nonlinearity. It can be extended to other crossbar structures/devices by replacing the circuit/device models.
- Using the conversion algorithm according to an example embodiment, the output error (OE) can be reduced to <3.5% for signed floating-point convolution with low device usage and input resolution.
- Irrespective of the number of kernels operating on each image, an example embodiment can process the negative floating-point elements of all the kernels within 4 RRAM arrays using the M2M method according to an example embodiment. This reduces the device requirement and power utilization.
- The hardware-aware system according to an example embodiment achieves >99% MNIST classification accuracy for a 4-layer DNN using a 3-bit input resolution and 4-bit RRAM resolution. An example embodiment improves power-efficiency by 5.1× and area-efficiency by 4.18× over state-of-the-art accelerators.

Convolutional Neural Network (CNN) Basics

DNNs, typically consist of multiple convolution layers for feature extraction followed by a small number of fully-connected layers for classification. In the convolution layers, the output feature maps are obtained by sliding multiple 2-dimensional (2D) or 3-dimensional (3D) kernels over the inputs. These output feature maps are usually subjected to max pooling, which reduces the dimensions of the layer by combining the outputs of neuron clusters within one layer into a single neuron in the next layer. A cluster size of 2×2 is typically used and the neuron with the largest value within the cluster is propagated to the next layer. Max-pool layer outputs, subjected to activation functions such as ReLU/Sigmoid, are fed into a new convolution layer or passed to the fully-connected layers. Equations for convolution of x input images ([B]) with kernels ($[A]_{m\times n}^{1,p}$) and subsequent max-pooling with a cluster size of 2×2 to obtain output $[C]^1$ are given below:

$$Y_{i,j}^{l} = \sum_{p=0}^{x-1}\sum_{a=0}^{m}\sum_{b=0}^{n} A_{a,b}^{l,p} \times B_{i+a,j+b} \tag{1}$$

$$C_{i,j}^{l} = \max\{Y_{u,v}^{l};\ x \in (2u, 2u+1),\ y \in (2v, 2v+1)\} \tag{2}$$

In an example embodiment, the focus is on the acceleration of the inference engine where the weights have been pre-trained. Specifically, an optimized system for efficient convolution layer computations is provided according to an example embodiment, since they account for more than 90% of the total computations.

RRAM-Based In-Memory Computation

Previously reported in-memory vector-matrix multiplication techniques store weights of the neural network as continuous analog device conductance levels and employ pulse-amplitude modulation for the input vectors to perform computations within the RRAM array (FIG. 1(*b*)). Upon voltage pulse application at the word-line inputs, Ohm's and Kirchoff's laws determine the current flowing through each bit-line. Sense amplifiers (SAs) combined with basic hold circuits convert the bit-line current to voltage and hold the analog output to enable Analog-to-Digital Converter (ADC) sharing to save computational power. ADC outputs obtained after converting the crossbar's voltage outputs to digital signals are mapped-back to floating-point elements using non-linear map-back functions. However, such execution increases peripheral overheads and results in high susceptibility to noise. An example embodiment aims to reduce the periphery and improve the robustness of the system.

Planar Staircase Array According to an Example Embodiment

As mentioned above, most reported works use a 2D-planar layout (Manhattan layout)] that requires matrix unfolding into vectors and massive input regeneration (FIG. 1(*b*)) for convolution operations. To eliminate these issues and increase Input feature map reuse, a planar RRAM array 100 with staircase routing for the bit-lines e.g. 102 which constitute the bottom electrode layer (FIG. 1(*c*)) is provided. In the layout according to an example embodiment, each bit-line e.g. 102 gets connected to one or more RRAMs cells e.g. 104, 106 along different levels of the array 100 storing different kernel elements, based on the outputs each input signal contributes to. In other words, at least a portion of the bit-lines e.g. 102 are staggered such that a location of a first cross-point between the bit-line e.g. 102 and a first word-line e.g. 105 (i.e. RRAM cell 104) is displaced along a direction of the word-lines compared to the cross-point between the bit-line e.g. 102 and a second word-line e.g. 103 adjacent the first word-line e.g. 105 (i.e. RRAM cell 106). In the example embodiment, the RRAM cells e.g. 104, 106 are programmed by applying programming pulses to the word-lines e.g. 103, 105 in the top electrode layer.

The staircase routing for the bit-lines e.g. 102 results in the auto-shifting of inputs and facilitates the parallel generation of convolution output with minimal input regeneration. From FIG. 1(*c*), it can be observed that the output generation using the layout according to an example embodiment does not require matrix unfolding as each sub-array e.g. 112 is configured to take inputs from the same row of the input matrix e.g. $b_{51}$-$b_{55}$ and to have the elements of a row of a kernel (e.g. $a_{31}$, $a_{32}$, and $a_{33}$) applied in the DNN accelerator contributing to the output. This leads to lower pre-processing time.

Fabrication and Electrical Characterization according to an example embodiment

The lack of complex algorithms to map kernel elements to RRAM device locations according to an example embodiment reduces mapping complexity. After programming RRAM cells e.g. 104 (FIGS. 1(*c*) and 2(*a*) based on kernel values, voltage pulses are applied with duty cycle/width based on input matrix values to the bit-lines e.g. 102. Current flowing through each word-line e.g. 103 in the top electrode layer over processing time gets integrated and converted to digital signals in the analog to digital converter and sense amplifier, ADC/SA 120. A linear transformation applied to these digital signals generates the floating-point output matrix elements.

In an array according to an example embodiment, the RRAM cells e.g. 106 comprises an $Al_2O_3$ switching layer contacted by the bit-lines e.g. 102 at the bottom and the word-lines e.g. 103 at the top. The array 100 is fabricated by first defining the bottom electrode layer with the staircase bit lines (e.g. 102) layout via lithography and lift-off of the 20 nm/20 nm Ti/Pt deposited using electron beam evaporator. Following this, a 10 nm of $Al_2O_3$ switching layer is deposited using atomic layer deposition at 110° C. The top electrode layer with the word lines e.g. 103 is subsequently defined using another round of lithography and lift-off of 20 nm/20 nm Ti/Pt deposited via electron beam evaporator. The final stack of each cell e.g. 106 fabricated in the array is Ti/Pt/$Al_2O_3$/Ti/Pt. FIG. 2(*a*) shows the SEM image of an $Al_2O_3$ staircase array 220 according to an example embodiment.

It is noted that in various example embodiments the switching layer comprises $Al_2O_3$, $SiO_2$, $HfO_2$, $MoS_2$, $TaO_x$, $TiO_2$, $ZrO_2$, ZnO etc., at least one of the bottom and top electrode layers comprises an inert metal such as Platinum, Palladium, Gold, Silver, Copper, Tungsten etc., and at least one of the bottom and the top electrode layers may comprise a reactive metal such as Titanium, TiN, TaN, Tantalum etc.

The RRAM DC-switching characteristics from the $Al_2O_3$ staircase array 220 according to an example embodiment show non-volatile gradual conductance reset over a 10× conductance change across a voltage range of −0.8 V to −1.8 V (FIG. 2(*b*)). Cumulative Distribution plot of the Set/Reset voltages for 15 RRAM devices over 50 cycles (FIG. 2(*c*)) shows a tight distribution, implying low device-to-device and cycle-to-cycle variability. FIG. 2(*d*) confirms that the conductance curve of multiple fabricated RRAM devices according to an example embodiment as a function of 100 reset pulses demonstrates a 5× linear reduction. Here, the conductance curve is divided into 8-states ($s_0$-$s_7$) based on the observed device variability. For system analysis, a hysteron-based compact model, developed by Lehtonen et. al., has been calibrated to the $Al_2O_3$ RRAM according to an example embodiment. FIG. 2(*e*) shows the HSPICE-compact model behavior for the RRAM according to an example embodiment, which demonstrates a good correlation with the experimental data. In addition, guided by the current variation displayed in FIG. 2(*d*), a $\sigma/\mu$ of 0.2 was added to the RRAM current at each state to account for the device-to-device and cycle-to-cycle variability. Due to the above measures, the simulations performed according to an example embodiment account for the various RRAM device issues and provide an accurate estimate of the output error.

The RRAM according to an example embodiment is fully compatible with CMOS technology in terms of both materials, low temperature (<120° C.) suitable with back end of line (BEOL) and processing techniques employed. The $Al_2O_3$-RRAM device according to an example embodiment is almost forming free, implying that there is no permanent damage to the device after initial filament formation, and does not limit the device yield. Therefore, the $Al_2O_3$ RRAM devices according to an example embodiment can be easily scaled down to the sub-nm range. It is noted that, the arrays fabricated at larger node in an example embodiment are used to evaluate the efficacy of the layout, and proposed in-memory compute schemes and can be replaced with other compatible materials at lower nodes.

Modifications According to Example Embodiments

It is noted that in different example embodiments, the lines in the top electrode layer can be staggered and function as the bit-lines, and the current can be collected from straight lines in the bottom electrode layer functioning as the word-lines. Also, it is noted that in different example embodiments, the word-lines can be staggered instead of the bit-lines. Further, the RRAM devices used in the example embodiment described can be replaced and the layout can be extended to other memories capable of in-memory computing in different example embodiment, including, but not limited to, Phase-Change Memory (PCM), and Conductive Bridging RAM (CBRAM), using materials such as, but not limited to GeSbTe, Cu—$GeSe_x$.

Array Size Evaluation according to an example embodiment With reference again to FIG. 1(*c*) the complete array 100 layout according to an example embodiment for convolution execution comprises multiple sub-arrays e.g. 112, with staircase bottom electrode routing. Multiple such sub-arrays contributing to the same outputs constitute an Array-Structure (AS) e.g. 114, and numerous such AS e.g. 114 sharing bottom electrodes form the array 100. Consecutive AS e.g. 114, 116 are flipped versions of each other and connected using staircase routing. Such connections further reduce input regeneration and result in a multifold improvement in performance. In an example embodiment, the staircase array uses 3 metal layers, the BE, TE and a metal layer beneath the BE layer to enable connection of the intermediate inputs (e.g. the inputs for $b_{14}$, $b_{15}$, $b_{24}$, $b_{25}$, $b_{34}$, $b_{35}$) to external CMOS circuits, here to external DAC 117, 118, 119. For an AS e.g. 114 with x outputs, each sub-array e.g. 112 takes $t_1+t_2=x-1+r$ pulse inputs, resulting in a total array outputs of $x \times n$. Furthermore, for outputs $x \geq r+1$, the total number of pulse inputs to the array$=(t_1+t_2)\times(r_1+n-1+(0.5\times(r_1-1)\times(n-1)))$; while for $x<r+1$, the total number of DAC inputs to the array$=((r+x-1)\times(r_1+n-1))+((x-1)\times(r_1-1)\times(n-1))$. Here, r is the number of kernel rows (Kernel_rows), $r_1$ is the number of kernel columns (Kernel_columns), n is the number of AS in the array (#AS).

An increase in the routing length due to the staircase routing according to an example embodiment would result in larger line parasitic resistances and capacitances in the array. Hence, the effect of an increase in the outputs/AS (x) on the current was evaluated using HSpice and the results are shown in FIGS. 3(*a*) and (*b*). For this evaluation, the line resistance was extracted to be 1Ω between adjacent tracks and via resistance to be 55Ω from the full layout design according to an example embodiment in cadence and was crosschecked with previous works. Considering the filamentary nature of the $Al_2O_3$ RRAM device switching (FIG. 2(*e*)), the increase in resistance, resulting from the elimination of leakage currents with scaling, was neglected and the power/I-R drop analyses was based on the measurements at the $2\times2$ $\mu m^2$ range. It is noted that, area of the devices has been scaled based on the metal pitch at the 40 nm technology node. From the device data according to an example embodiment, the resistances for different states at $V_{read}$=0.1V (CC=100 μA) were derived for the analysis. As described above, an increase in the number of outputs requires an increase in the number of inputs connected to each sub-array. The larger number of inputs leads to increased route lengths within each sub-array and between consecutive AS, resulting in the observed variation. A rise in outputs from 1 to ceil(r/2)+1 sees an increment in devices connected to the input lines accompanied by a surge in line parasitic, leading to a drop in system current (FIGS. 3(*a*) and (*b*)). Here, ceil(x) is the integer closest in value to x and is ≥x. Beyond this threshold, the inputs shared between inconsecutive AS decrease, reducing the current degradation. However, a precipitous surge was observed in AS routing beyond outputs=r+1, which leads to an exponential drop in system current. Owing to this trend, the optimum number of outputs per AS=r+1 for Kernels with size >7×7, according to an example embodiment.

As each array is a union of multiple AS sharing inputs, it is important to understand the impact of an increase in the number of AS on the system performance according to an example embodiment. For this evaluation, a 3×3 array with 26 outputs per AS was considered and the results shown in FIGS. 3(*c*) and (*d*). Beyond outputs/AS (x)=r+1, an increase in AS neither alters the input route length nor the current. Hence, no significant current drop was observed with an increase in AS. This property can be exploited according to an example embodiment to build dense arrays generating many outputs to improve throughput and decrease input regeneration.

Furthermore, the staircase array output current according to an example embodiment was compared with that of the Manhattan and staggered-3D arrays in FIG. 3(*e*). For the Manhattan array layout, inputs to array$=r_1\times r$, outputs$=(r+1)\times r_1$. For the staircase array according to an example embodiment, inputs per sub-array $(t_1+t_2)=2\times r$, outputs $(x\times n)=(r+1)\times r_1$, #AS $(n)=r_1$. Descriptions of different variables remain unchanged. For the staggered-3D array, total outputs$=(2r+1)\times r_1$, total inputs$=(3r-1)\times r_1$, RRAMs connected to each output=r and total current shown in FIG. 3(*e*)=(current per Output)$\times r_1$. It was assumed that all the considered layouts have copper interconnects, which results in a via resistance of 552 and line resistance of 1Ω between adjacent tracks. From FIG. 3(*e*), it can be inferred that though the longer routes increase line parasitic in planar-staircase arrays according to an example embodiment, the lower number of devices connected to each input leads to a lower current flow, thus reducing the I-R drop. This reduction makes the planar-staircase array according to example embodiment more resilient to line-parasitic compared to the Manhattan Array. Though the staggered-3D array leads to lower I-R drop and sneak current issues owing to its high via resistance, it reduces the system performance owing to larger periphery requirements, as will be discussed in more detail below.

In-Memory M2M Execution According to an Example Embodiment

While neural networks mandate low quantization error (QE) and high accuracy, the RRAM states (minimum of 6-bit) required to achieve this are difficult to be demonstrated on a single device. RRAM device variability further exacerbates the issue. Hence, in an example embodiment, an M2M method was delineated that achieves high output accuracy with low input resolution while combating device issues and improving throughput. To tolerate device nonlinearity and reduce interface overheads, pulse-width modulation was employed instead of amplitude-modulation to represent the input vectors (FIG. 1(*c*)). Furthermore, to develop a system resilient to device variations, the RRAM device conductance was discretized according to an example embodiment, closer to the more stable low-resistance (LRS), based on device-variability. Matrix A/Kernel ([A]) elements are mapped onto one of the device conductance states while input voltage pulses with pulse-width based on matrix B/input feature map ([B]) are applied to the word-lines according to an example embodiment, as depicted in FIG. 1(*f*).

M2M Methodology According to an Example Embodiment

To facilitate the processing of signed floating-point numbers using a single array according to an example embodiment, the input matrices are split into two substituent matrices:

$$[A]_{a\times b}=[A_1]_{a\times b}+(\mathrm{sign}(\min([A]))\times[U_1]_{a\times b}) \quad (3)$$

$$[B]_{n\times t}=[B_1]_{n\times t}+(\mathrm{sign}(\min([B]))\times[U_2]_{n\times t}) \quad (4)$$

Thus, the output feature map, [C], becomes:

$$\begin{aligned}[C]_{(n-a+1)\times(t-b+1)} &= [B]\otimes[A] \quad (5)\\ &= ([B_1]+\mathrm{Sign}(\min([B]))\times[U_2])\otimes \\ &\quad ([A_1]+\mathrm{Sign}(\min([A]))\times[U_1]) \\ &= [B_1]\otimes[A_1]+I_1([B_1]\otimes[U_1])+ \\ &\quad I_2([U_2]\otimes[A_1])+I_1I_2([B_1]\otimes[U_1])\end{aligned}$$

Here min([X]) represents the minimum among the elements of [X]; $[U_1]$ is an a×b dimension matrix with all its elements equal to abs(min([A])) and $[U_2]$ is an n×t matrix with each of its elements equal to abs(min([B])). Here, abs(X) gives the absolute value of X and $I_1$=Sign(min([A])), $I_2$=Sign(min([B])). Although this transformation results in four matrices $[A_1]$, $[B_1]$, $[U_1]$, $[U_2]$ from the original [A] and [B], every element of resultant matrices is ≥0, making it possible for them to be processed using a single Crossbar array. Furthermore, the range of elements in [A] remains unaltered in $[A_1]$, while $[U_1]$ enables the processing of negative floating-point numbers of the input kernels. Similarly, $[B_1]$ preserves the range of [B] while $[U_2]$ helps process its negative elements. It was detailed that a 6-bit resolution is required to achieve an output degradation of <6%. However, the demonstration of 64 low-variability states within each RRAM is difficult. Hence, a new methodology was developed according to an example embodiment that lowers RRAM state requirements by splitting the resultant matrices further (FIG. 1(*f*)). To execute high-accuracy computations with low RRAM-states, the resultant matrix $[A_1]$ is split into two matrices:

$$M_{1,ij}=\begin{cases}0;\ \text{if } A_{1,ij}<X\\ A_{1,ij}-X;\ \text{if } A_{1,ij}\ge X\end{cases};\ 0<X<\max([A_1]) \quad (6)$$

$$[M_2]=[A_1]-[M_1] \quad (7)$$

Based on (3), $\max([A_1])=\max([A])+\mathrm{abs}(\min([A]))$. The above split generates 2 matrices $[M_1]$ and $[M_2]$ each with element range lower compared to $[A_1]$: $0\le M_{1,ij}<\max([A_1])-X$; $0\le M_{2,ij}\le X$. Lowering the range of individual matrices reduces the quantization step, thereby reducing QE. Furthermore, $[U_1]$ is split into $[M_3]$, $[M_4]$ as (8), to reduce the effect of device non-linearity on output:

$$M_{3,ij}=0$$

$$M_{4,ij}=\mathrm{abs}(\min([A])) \quad (8)$$

Post the split, elements of thus derived matrices are mapped to device conductance states, for in-memory computation, using the quantization step ($\Delta_x$).

State Matrix Derivation:

Post the matrix split detailed in (6)-(8) above, elements of the derived matrices are mapped to device conductance states, for in-memory computation, using the quantization step ($\Delta_x$):

$$\Delta_{M_1}=\frac{\max([A_1])-X}{R_1-1} \quad S(1)$$

$$\Delta_{M_2}=\frac{X}{R_2-1}$$

$$\Delta_{M_3/M_4}=\frac{\mathrm{abs}(\min([A]))}{R_3-1}$$

In above equations, abs(X): the absolute value of X, $[M_x]$: matrices derived from splitting $[A_1]$, $[M_{3/4}]$: matrices derived from splitting $[U_1]$, $0<X<\max([A_1])$; $R_1$, $R_2$, $R_3$: number of RRAM conductance states used for processing $[M_1]$, $[M_2]$, $[M_{3/4}]$ respectively. Similarly, derived matrices of [B] ($[B_1]$ & $[U_2]$) are mapped to input pulse widths using the quantization step, $A_2$, derived as:

$$\Delta_2=\begin{cases}\dfrac{\max([B])-\min([B])}{m-1};\\ \max([B])-\min([B])>\mathrm{abs}(\min([B]))\\ \dfrac{\mathrm{abs}(\min([B]))}{m-1};\ \text{otherwise}\end{cases} \quad S(2)$$

Here, m: number of levels the input pulse has been divided into. Using this quantization step, we map elements of the derived matrices $[M_{1/2/3/4}]$ to RRAM conductance states and $[B_1]/[U_2]$ to input pulse levels. The two state matrices ($[Sz_{tx}]$ & $[Sz_{ty}]$) of each of the derived matrices are determined as:

$$[Z_t]\rightarrow([S_{Ztx}],[S_{Zty}]) \quad S(3)$$

$$S_{Ztx,ij}=\mathrm{floor}\left[\frac{Z_{t,ij}}{\Delta_{M_1/M_2/2}}\right]$$

$$S_{Zty,ij}=\mathrm{ceil}\left[\frac{Z_{t,ij}}{\Delta_{M_1/M_2/2}}\right]$$

When $[Z_t]=[M_1]$, $\Delta_{M1}$ is used. For $[M_2]$, $\Delta_{M2}$ is used and $\Delta_2$ is used when $[Z_t]=[B_1]/[U_2]$, for the state transformation. Such mapping of each element to 2 RRAM devices lowers output QE and combats device-variability issues. Elements of $[M_3]$ and $[M_4]$ are mapped as:

$$S_{M3x,ij}=0;S_{M3y,ij}=0$$

$$S_{M4x,ij}=R_3-1;S_{M4y,ij}=R_3-1 \quad \text{S(4)}$$

Due to the above transformation, independent of abs(min([A])), every element of the state matrices of $[M_3]$ and $[M_4]$ get mapped to 0 and $R_3-1$ respectively. Thus, irrespective of the number of kernels operating on an input matrix, $[S_{M3,x/y}]$ & $[S_{M4,x/y}]$ elements need to be stored and processed just once per input matrix. Each element of $[S_{M1x/y}]$, $[S_{M2x/y}]$, $[S_{M3x/y}]$, $[S_{M4x/y}]$ represents one of the RRAM conductance states ($s_0$-$s_{max}$). Based on $[S_{B1x}]$, $[S_{B1y}]$, $[S_{U2x}]$, $[S_{U2y}]$ read pulse width applied to word line is determined as:

$$\text{Pulse Width} = \frac{\text{Total Pulse Width}}{m-1} \times \text{State Matrix Element} \quad \text{S(5)}$$

Upon state matrix determination, the RRAM arrays are programmed based on the kernel's state matrices. $[S_{B1x}]/[S_{U2x}]$ elements are applied to RRAMs storing $[S_{Mjx}]$ elements and $[S_{B1y}]/[S_{U2y}]$ are applied to $[S_{Mjy}]$ elements (j=1,2,3,4) (FIG. 1(*e*)). Current flowing through the bit-lines integrated over the processing time is converted to digital signals using an ADC.

The output feature map ([C]) given by (5) above, which is the convolution output of [A] and [B], is derived as:

$$[C]=[B]\otimes[A]=[C_1]+\text{sign}(\min([B]))[C_J]$$

$$[C_1][C_{I1}]+[C_{I2}]+\text{sign}(\min([A]))([C_{I3}]+[C_{I4}])$$

$$[C_J][C_{J1}]+[C_{J2}]+\text{sign}(\min([A]))([C_{J3}]+[C_{J4}]) \quad \text{S(6)}$$

Each of the components of S(6) are obtained as:

$$[C_{It}] = [B_1] \otimes [M_t] = \frac{([S_{B1x}] \otimes [S_{Mtx}]) + ([S_{B1y}] \otimes [S_{Mty}])}{2} \quad \text{S(7)}$$

$$[C_{Jt}] = [U_2] \otimes [M_t] = \frac{([S_{U2x}] \otimes [S_{Mtx}]) + ([S_{U2y}] \otimes [S_{Mty}])}{2}$$

In S(7), the convolution of $[M_t]$ with $[B_1]/[U_2]$ is carried out within the staircase array. ADC outputs, obtained after converting the integrator outputs to digital signals, are transformed into floating-point numbers using the below equation:

$$C_{It,ij} = \frac{\left(|V_{It,ij}| - p\sum_{w,r=0.0}^{a,b} S_{B1x,(i+w,j+r)} + S_{B1y,(i+w,j+r)}\right)\Delta_{Mt}\Delta_2}{2q} \quad \text{S(8)}$$

$$C_{Jt,ij} = \frac{\left(|V_{Jt,ij}| - p\sum_{w,r=0.0}^{a,b} S_{U2x,(i+w,j+r)} + S_{U2y,(i+w,j+r)}\right)\Delta_{Mt}\Delta_2}{2q}$$

$$p = \frac{c \times \tau_p}{\text{Cap}_1}; q = \frac{m \times \tau_p}{\text{Cap}_1} \quad \text{S(9)}$$

Where, $V_{It/Jt}$: voltage accumulated at the integrator output, c: intercept of RRAM conductance line, m: the slope of the line representing RRAM conductance, $\text{Cap}_1$: the capacitance associated with the integrator circuit, $\tau_p$=Total Pulse Width/(m−1).

For neural networks using activation functions such as ReLU/Sigmoid, min([B])=0, thus resulting in $U_{2i,j}=0$. Assuming that $[A_1]$ and $[U_1]$ have been split into 2 matrices each, S(6) evolves into S(10) for neural networks:

$$\begin{aligned}[C] &= [B] \otimes [A] \\ &= ([B] \otimes [M_1]) + ([B] \otimes [M_2]) + \text{sign}(\min([A]))(([B] \otimes [M_3]) + \\ &\quad ([B] \otimes [M_4]))\end{aligned} \quad \text{S(10)}$$

In the method according to an example embodiment, independent of abs(min([A])), every element of the state matrices of $[M_3]$ and $[M_4]$ get mapped to 0 and $R_3-1$ respectively. Thus, irrespective of the number of kernels operating on an input matrix, $[M_3]$ & $[M_4]$ state matrix elements need to be stored and processed just once per input matrix.

Upon state matrix determination, the RRAM arrays are programmed based on the kernel's state matrices while state matrices of $[B_1]/[U_2]$ determine the pulse widths applied to the word lines (FIG. 1(*e*)). Current flowing through the bit-lines integrated over the processing time is converted to digital signals using an ADC. Derivation of the output feature map ([C]) given by (5), which is the convolution output of [A] and [B], requires a linear transformation as detailed above. Lack of complex functions to map-back the ADC outputs to floating-point numbers in according to an example embodiment further reduces the power consumed by digital circuits of the accelerators.

Also, the split of $[A_1]$ & $[U_1]$ lowers QE considerably due to the reduction in element range of the resultant matrices according to an example embodiment.

Quantization Error Calculation:

Consider an element, $a_x \in [A]$, min([A])<0 and $b_i \in [B]$. Here, $a_x$ can be split into $a_i$ and $t_1$ as: $a_x=a_i-t_1$ where $a_i \in [A_1]$ and $t_1$=abs(min([A])). Assuming min([B])=0, $n_2$=floor($b_i/\Delta_2$) and $(n_2+1)$=ceil($b_i/\Delta_2$), min([B])=0, we get:

$$b_i=n_2\Delta_2+\delta_2=(n_2+1)\Delta_2+\delta_2-\Delta_2 \quad \text{S(11)}$$

In S(11), $0<\delta_2<\Delta_2$. For $t_1$, floor($t_1/\Delta_{M3}$)=ceil($t_1/\Delta_{M3}$)=$R_3-1$. Hence, $$t_1=\text{abs}(\min([A]))=(R_3-1)\Delta_{M3} \quad \text{S(12)}$$

The value of $t_1 \times b_i$ is calculated using the proposed method as:

$$t_1 \times b_i = \frac{((R_3-1)\Delta_{M3} \times (n_2\Delta_2+\delta_2)) + ((R_3-1)\Delta_{M3} \times ((n_2+1)\Delta_2+\delta_2-\Delta_2))}{2} \quad \text{S(13)}$$

The QE incurred at the output due to such mapping is:

$$\begin{aligned}\nabla_3 &= (t_1 \times b_i) - \frac{\left[\text{floor}\left(\frac{t_1}{\Delta_{M3}}\right)\text{floor}\left(\frac{b_i}{\Delta_2}\right) + \text{ceil}\left(\frac{t_1}{\Delta_{M3}}\right)\text{ceil}\left(\frac{b_i}{\Delta_2}\right)\right]\Delta_2\Delta_3}{2} \\ &= (t_1 \times b_i) - \frac{((R_3-1)\Delta_{M3} \times n_2\Delta_2) + ((R_3-1)\Delta_{M3} \times (n_2+1)\Delta_2)}{2}\end{aligned} \quad \text{S(14)}$$

-continued $$= (R_3 - 1)\Delta_{M3}\delta_2 - \frac{(R_3 - 1)\Delta_{M3} \times \Delta_2}{2}$$

$$= t_1\delta_2 - \frac{t_1 \times \Delta_2}{2}$$

Similar to S(14), one can calculate the QE for multiplication of $a_i$ with $b_i$. But, unlike $t_1$, there are 2 possibilities for $a_i$.

Case 1: $a_i$<X $$a_i = n_a\Delta_{M2} + \delta_a = (n_a + 1)\Delta_{M2} + \delta_a - \Delta_{M2} \quad S(15)$$

In S(15), $0<\delta_a<\Delta_{M2}$. The output of in-memory multiplication between $a_i$ and $b_i$ is given by S(16) while the ideal output is given in S(17):

$$T_a = \left\{\text{floor}\left[\frac{a_i}{\Delta_{M2}}\right]\text{floor}\left[\frac{b_i}{\Delta_2}\right] + \text{ceil}\left[\frac{a_i}{\Delta_{M2}}\right]\text{ceil}\left[\frac{b_i}{\Delta_2}\right]\right\} \times \frac{\Delta_{M2}\Delta_2}{2} \quad S(16)$$

$$a_i \times b_i = \frac{((n_a\Delta_{M2} + \delta_a) \times (n_2\Delta_2 + \delta_2)) + (((n_a + 1)\Delta_{M2} + \delta_a - \Delta_a) \times ((n_2 + 1)\Delta_2 + \delta_2 - \Delta_2))}{2} \quad S(17)$$

Using S(16)-S(17) and calculating $\nabla_a = I_a - T_a$, we get:

$$\nabla_a = n_a\Delta_{M2}\delta_2 + n_2\Delta_2\delta_a + \delta_a\delta_2 - \frac{(n_a + n_2 + 1)\Delta_2\Delta_{M2}}{2} \quad S(18)$$

Since $a_i$<X, its corresponding element in $[M_1]$ is 0 and hence $\nabla_b = I_b - S_b = 0$. Hence, the final QE for $a_x \times b_i$ can be derived as:

$$\begin{aligned} \nabla_1 &= (0 + a_i - t_1) \times b_i - T \quad S(19) \\ &= \nabla_b + \nabla_a - \nabla_3 \\ &= n_a\Delta_{M2}\delta_2 + n_2\Delta_2\delta_a + \delta_2\delta_a - \frac{(n_a + n_2 + 1)\Delta_{M2}\Delta_2}{2} - \delta_2 t_1 + \frac{t_1\Delta_2}{2} \end{aligned}$$

Substituting $0<\delta_a<\Delta_{M2}$, $0<\delta_2<\Delta_2$ and $\Delta_{M2}=X/(R_2-1)$ in S(19), one gets:

$$\begin{aligned} &\text{abs}(\nabla_1) < \max\big((n_a + n_2 + 1)X - t_1(R_2 - 1), \quad S(20) \\ &\backslash(n_a - n_2 - 1)X + t_1(R_2 - 1)\big) \times \frac{\Delta_2}{2(R_2 - 1)} \end{aligned}$$

Case 2: $a_i$>X

For this case, $a_x$ can be rewritten as:

$$a_x - (a_i - X) + X - t_1 \quad S(21)$$

Similar to S(14), QE for the multiplication of X and $b_i$ can be derived as:

$$\nabla_a = X\delta_2 - \frac{X \times \Delta_2}{2} \quad S(22)$$

QE for $(a_i-X)\times b_i$ can be derived similar to S(18) and is given as:

$$\nabla_b = n_b\Delta_{M1}\delta_2 + n_2\Delta_2\delta_b + \delta_b\delta_2 - \frac{(n_b + n_2 + 1)\Delta_2\Delta_{M1}}{2} \quad S(23)$$

In S(13), $n_b$=floor($(a_i-X)/\Delta_{M1}$). Substituting S(14), S(22) and S(23) in S(19), one gets:

$$\begin{aligned} \nabla_2 &= (a_i - X + X - t_1) \times b_i - T \quad S(24) \\ &= ((a_i - X) \times b_i + (X \times b_i) - (t_1 \times b_i)) - T \\ &= \nabla_b + \nabla_a - \nabla_3 \\ &= n_b\Delta_{M1}\delta_2 + n_2\Delta_2\delta_b + \delta_2\delta_b - \frac{(n_b + n_2 + 1)\Delta_{M1}\Delta_2}{2} + \delta_2 X - \frac{X\Delta_2}{2} - \delta_2 t_1 + \frac{t_1\Delta_2}{2} \\ &= n_b\Delta_{M1}\delta_2 + n_2\Delta_2\delta_b + \delta_2\delta_b - \frac{(n_b + n_2 + 1)\Delta_{M1}\Delta_2}{2} + \delta_2(X - t_1) - \frac{(X - t_1)\Delta_2}{2} \end{aligned}$$

Substituting $0<\delta_b<\Delta_{M2}$ and $0<\delta_2<\Delta_2$ in S(24), one gets:

$$-\left[\frac{\frac{(n_a + n_2 + 1)(\max([A_1]) - X)}{R_1 - 1} + (X - t_1)}{2}\right]\Delta_2 < \nabla_2 < \left[\frac{\frac{(n_a + n_2 + 1)(\max([A_1]) - X)}{R_1 - 1} + (X - t_1)}{2}\right]\Delta_2 \quad S(25)$$

Here, the expected output (T) is obtained using the RRAM crossbar array and the quantization error per multiplication is given by $V_x$. By using both floor and ceiling state matrices for computation, one reduces the quantization error and makes it symmetric about 0.

To minimize the QE in S(20) & S(25) simultaneously, one needs to make $X=t_1$. When $X=\max([A_1])/2$ and for a distribution with max([A])=abs(min([A])) with $R_1=R_2=R_3=R$, one gets:

$$\text{abs}(\nabla_1) < \frac{(n_0 + R - (n_2 + 2)) \times \Delta_2 \times \max([A_1])}{4(R - 1)} \quad S(26)$$

$$\text{abs}(\nabla_2) < \frac{(n_b + n_2 + 1) \times \Delta_2 \times \max([A_1])}{4(R - 1)} \quad S(27)$$

Without the split given in matrix split, the resultant QE[8] is:

$$\frac{(n_1 - n_{11}) \times \max([A_1]) \times \Delta_2}{2(R - 1)} \le \nabla \le \frac{(2n_2 + (n_1 - n_{11})) \times \max([A_1]) \times \Delta_2}{2(R - 1)} \quad S(28)$$

In above equations, $n_1$=floor[$a_i/A_1$]; $n_2$=floor[$b_i/\Delta_2$]; $n_{11}$=floor(abs(min([A]))/$\Delta_1$); $\Delta_1$,$\Delta_2$: step sizes for [A], [B] respectively. Comparing S(20), S(25) with S(28), one sees that the split of $[A_1]$ & $[U_1]$ lowers QE considerably.

Owing to this reduction, lower number of RRAM states and pulse levels can be used for high accuracy computations when $[A_1]$ is split. For applications requiring higher accuracy, $[M_{1/2}]$ can be further divided using the equations (6)-(7), to reduce QE, according to an example embodiment. As all elements of the derived matrices are ≥0, no changes to $[M_{3/4}]$, which deal with the negative floating-point elements, are made.

As every element of the state matrices of $[M_{3/4}]$ equals either 0 or $R_3-1$, further split of these matrices is not required to achieve higher QE. Further, it is seen that mapping each element of the resultant matrices of [A] & [B] to 2 state matrix elements results in lowering of output QE and making it symmetric about 0. Such QE minimization increases output accuracy and enables usage of lower RRAM resolution for high-accuracy computations.

Performance Evaluation of an Example Embodiment

FIG. 2(*e*) shows the HSPICE compact model behavior for $Al_2O_3$ RRAM according to an example embodiment, which represents the experimental data well. A software-based memory controller unit, written in Python, interfaced with MATLAB-coded compact RRAM models emulated the planar-staircase array according to an example embodiment to implement for all aspects of the system simulation. To begin with, the variation in output error (OE) with RRAM states and input pulse levels was analysed. The effect of splitting the matrices into multiple parts on the OE was also evaluated. For this analysis, a 100×100 input ([B]) and a 9×9 kernel were considered. Two sets of simulations, one with different matrix elements chosen at random from the interval [0,1] and the other from [−1,1], were performed, with 300 test cases for each unique combination of RRAM resolution and pulse levels. FIGS. 4(*a*) and (*b*) show the OE incurred as a function of RRAM resolution and input-pulse levels. Here, OE is derived as:

$$OE = \frac{(I - T) \times 100}{I} \tag{9}$$

While FIG. 4(*a*) delineates the effect of varying RRAM resolution on the error, FIG. 4(*b*) reports the impact of varying pulse resolution for two different RRAM resolutions. In accordance with S(23), FIGS. 4(*a*) and (*b*) show that an increase in RRAM resolution and pulse levels reduces OE due to the increase in the number of available bins and lower quantization step. Also, splitting the resultant matrices of $[A_1]$ further decreases OE due to the reduced range of the final matrices thus reducing quantization step. The lowered range of the resultant matrices enables the usage of lower resolution for similar output accuracy. For input image and kernel elements with all-positive elements, OE ~0.3% while it is <3.4% for matrices with signed floating-point elements. Comparing the OE for the split lower-resolution computations with unsplit high-resolution computations according to example embodiments shows that splitting the matrices results in lower OE (FIGS. 4(*a*) and (*b*)).

As can be seen from S(20), S(25), the value at which each matrix gets split into subsequent matrices (X) plays a crucial role in determining the OE. Hence, the effect of matrix split at different values of X on the OE was analyzed and the results documented in FIG. 4(*c*). Kernel and input sizes remain unchanged from the previous analysis with elements drawn at random from the interval [−1,1] for the kernel and [0,1] for the input. Similar to the previous simulations, 300 test cases for each combination of RRAM and pulse resolutions were considered. From FIG. 4(*c*) one observes that when X=max([Z])/2, equal element range for resultant matrices leads to the minimal error. The trend remains unchanged for the three considered combinations of RRAM and pulse resolutions.

Following the thorough evaluation of various parameters on the output accuracy according to example embodiment, the impact of these parameters on the system power was assessed using planar staircase arrays according to an example embodiment with 120 outputs. As ADC and Digital-to-Analog Converter (DAC) account for ~90% of any DNN system power, the minimum ADC resolution required was evaluated as a function of array size, RRAM states, and pulse resolution (FIGS. 4(*d*) and (*e*)). In these graphs, the inputs represent the number of RRAMs contributing to each output. The minimum ADC resolution required to prevent OE degradation by <2% for different combinations of RRAM resolution, pulse levels, and contributing RRAMs are presented in these figures. Using the above result, the power required per convolution was evaluated for different encoding schemes (FIG. 4(*f*)). For this analysis, a planar staircase array according to an example embodiment with 120 outputs (12 AS, ten outputs/AS) with each output connected to 81 RRAM devices was considered. A complete utilization of the array was assumed. The resultant matrices derived from a matrix split stored on separate arrays. Furthermore, owing to the ceil and floor state matrices, each resultant matrix is stored in two separate arrays. Power and area estimates for the 1-bit DAC functioning at 0.1V according to an example embodiment are documented in the Table 1.

TABLE 1

Power and Area of different components

| COMPONENT | PROPERTIES | POWER | AREA |
|---|---|---|---|
| RRAM | 0.1 V $V_{read}$/ 16 states | 16.34 nW | 0.0081 $\mu mm^2$ |
| DAC | 1-bit/ 70 MHz | 1.61 μW | 0.166 $\mu mm^2$ |
| ADC | 8-bit/ 1.2 GHz | 2 mW | 0.0012 $mm^2$ |
| SA | — | 77.5 nW | 0.0391 $\mu mm^2$ |
| Multiplier | 16-bit/ 1.89 GHz | 0.188 mW | 0.002612 $mm^2$ |
| Adder | 16-bit/ 40 MHz | 1.703 μW | 16.5 $\mu mm^2$ |
| Maxpool | — | 0.4 mW | 0.00024 $mm^2$ |
| ReLU | — | 0.2 mW | 0.0003 $mm^2$ |
| Input Register | 2 KB | 1.24 mW | 0.0021 $mm^2$ |
| Output Register | 2 KB | 1.12 mW | 0.0021 $mm^2$ |
| eDRAM | 64 KB/4 banks/256 bus width | 20.7 mW | 0.083 $mm^2$ |
| eDRAM-to-IM | 384 wires | 7 mW | 0.09 $mm^2$ |
| Router | — | 10.5 mW | 0.03775 $mm^2$ |
| Hyper tile | — | 10.4 W | 22.88 $mm^2$ |
| Cycle time | 100 ns | | |

In FIG. 4(*f*), with an increase in pulse levels an increase in the system power was observed according to an example embodiment due to higher ADC resolution and DAC operating frequency. But, an increase in the RRAM states increases ADC & RRAM power consumption. Also, the greater the matrix split, the greater the ADC accesses, which leads to higher power consumption. Preferably, these factors are considered while designing an optimal system according to an example embodiment capable of achieving high output accuracy with minimal power consumption. To emphasize this, the power consumption by different encoding schemes to achieve similar output accuracy was compared in FIG. 4(*g*). One observes that S1_5_6 encoding scheme uses the least power for OE compared to other encoding schemes.

Accelerator Design According to an Example Embodiment

Neural Network Implementation According to an Example Embodiment

Following the evaluation of the in-memory compute methodology according to an example embodiment, DNNs were implemented using the co-designed system according to an example embodiment. A visual depiction of a 4-layer DNN 500, with all the involved processes and system architecture, is given in FIG. 5(*a*). For neural networks, activation functions used (ReLU, sigmoid) result in min ([B])>0. In addition, kernel weights can be represented as a gaussian function with a mean of 0. Thus, min([A])<0 and hence sign(min([A]))=−1. Substituting sign(min([A]))=−1 and sign(min([B]))=0 in (5) and using X=max($[A_1]$)/2, we get:

$$[C] = [C_{I1}] + [C_{I2}] - ([C_{I3}] + [C_{I4}]) \tag{10}$$

$$C_{ij} = \left( (|V_{I1,ij}| + |V_{I2,ij}|)\Delta_1 - (|V_{I3,ij}| + |V_{I4,ij}|)\Delta_3 / - 2(\Delta_1 - \Delta_3)p \sum_{a,b=0,0}^{m,n} B_{x,(i+m,j+n)} + B_{y,(i+m,j+n)} \right) \times \frac{\Delta_2}{2q}$$

In the above equation, $V_{It/Jt}$: voltage accumulated at the integrator output, $\Delta_{1/3}$: quantization step of $[M_x]$, $\Delta_2$: quantization step of the input image, $B_{xi,j}/B_{yi,j}$: $i^{th}$ row and $j^{th}$ column elements of the state matrices of the input image.

Figure 5A:
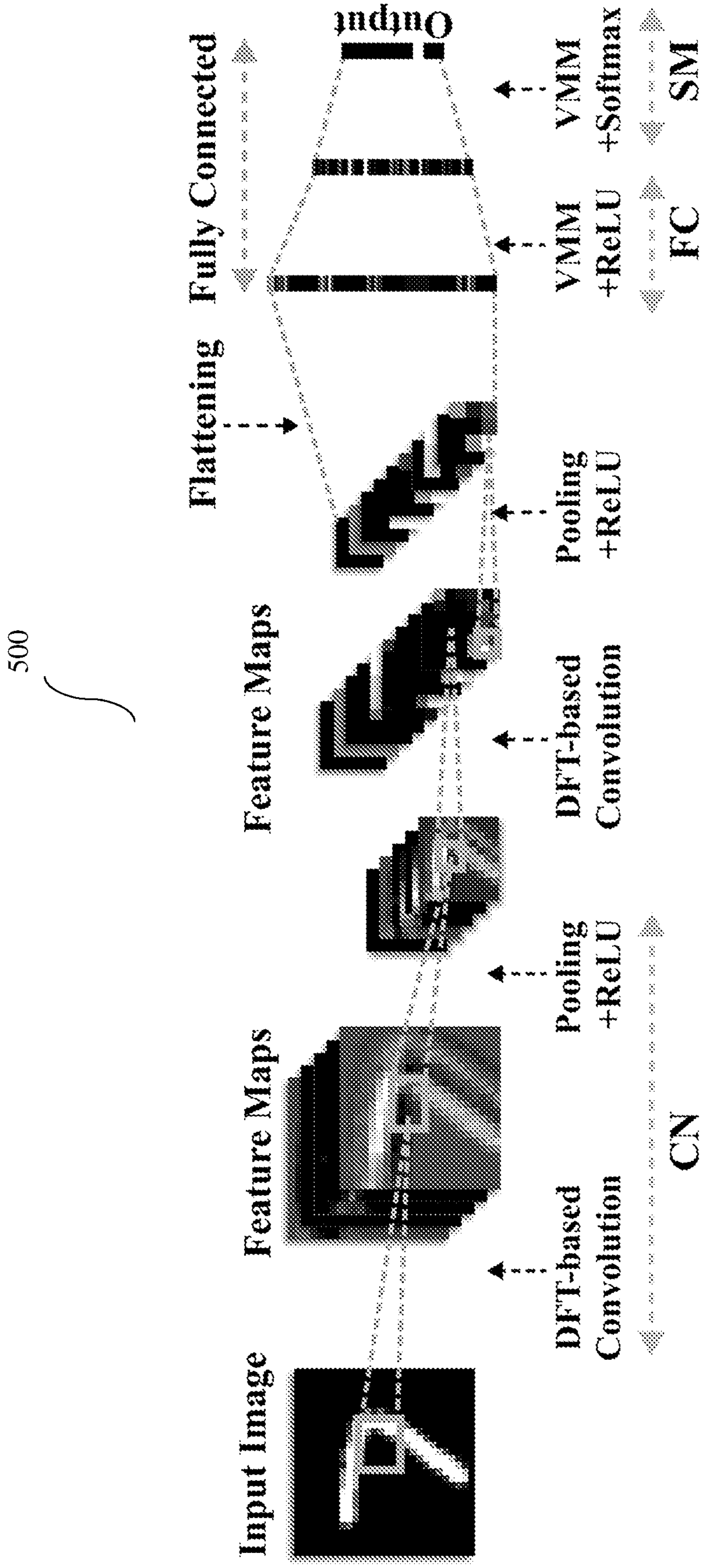
FIG. 5(*a*) shows a 4-layer DCNN flowchart for MNIST [23] classification and different processes involved, according to an example embodiment.
Figures 5B, 5C:
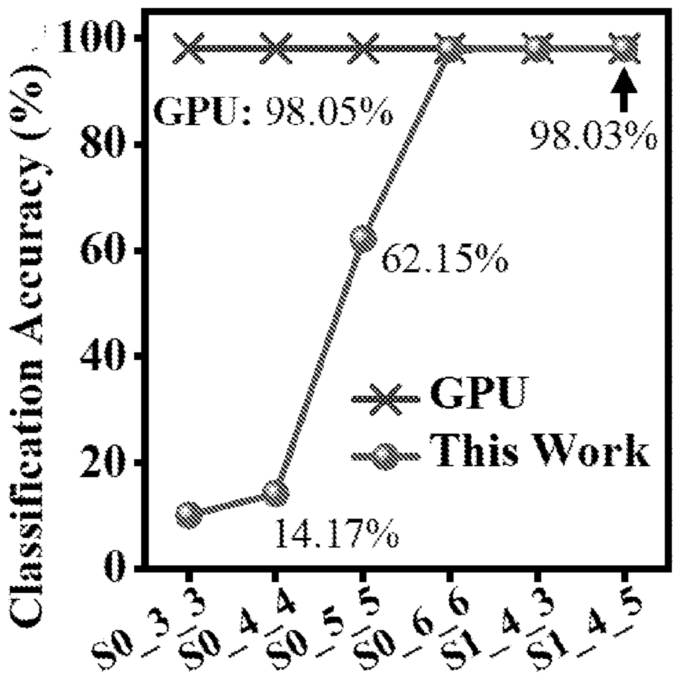
Figure 6A:
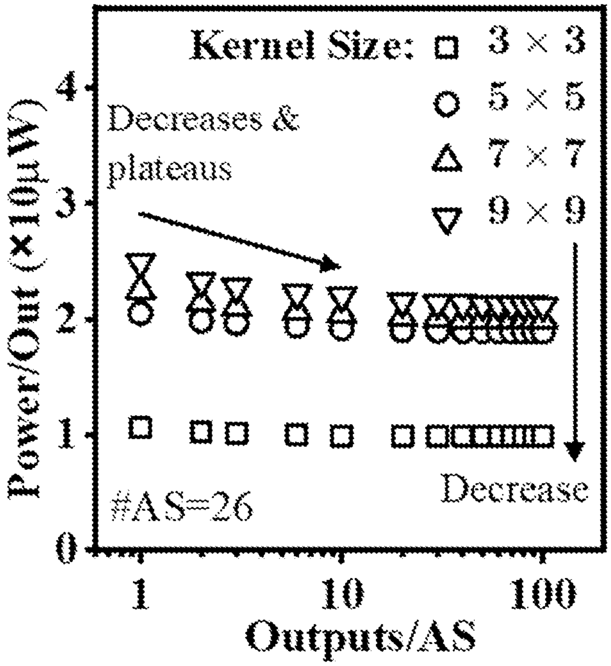
FIG. 6(*a*) shows the S1_4_3 ES analysis, specifically power consumed by the staircase array according to an example embodiment as a function of Outputs/AS, #AS=26.
Figure 6B:
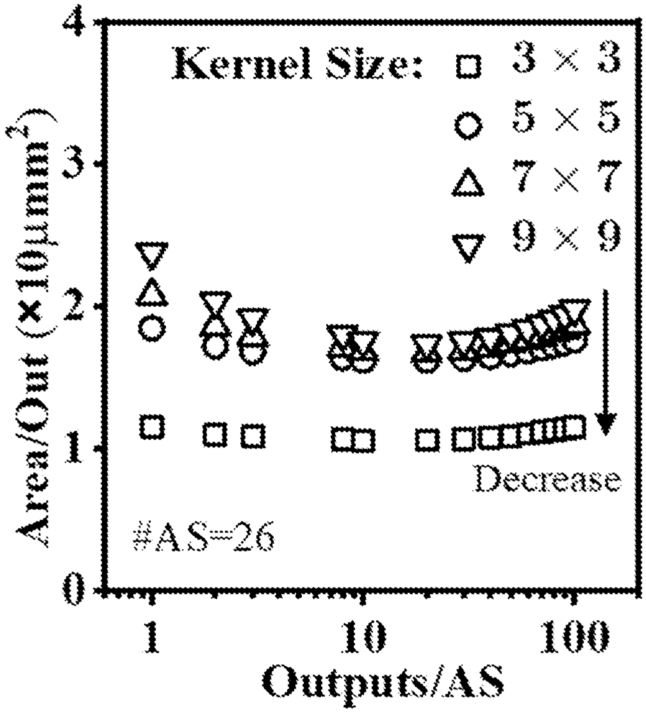
Figure 6C:
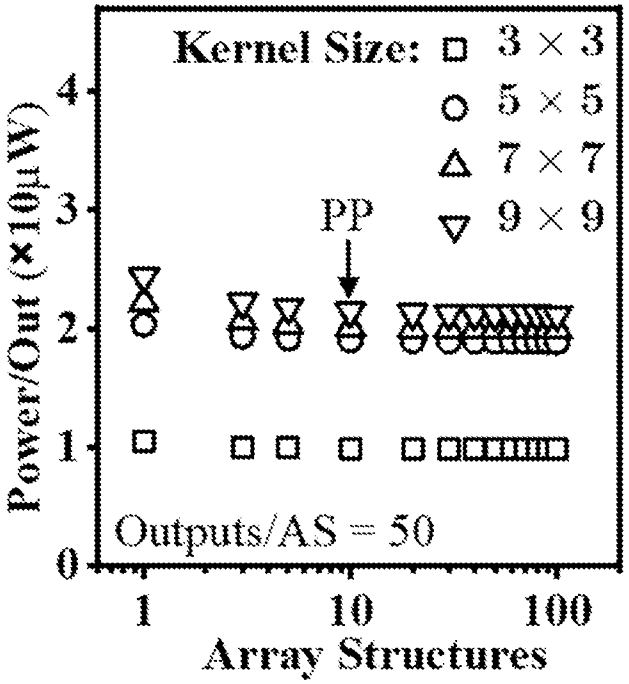
Figure 6D:
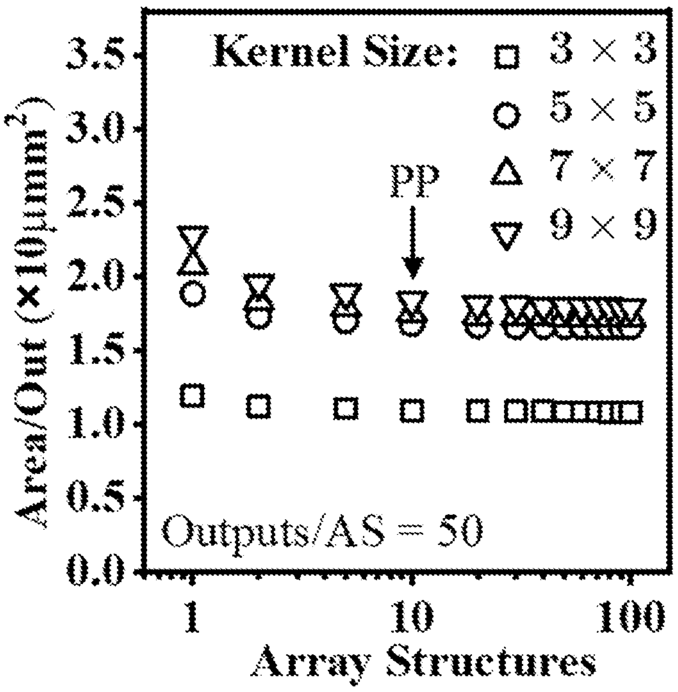
Figure 6E:
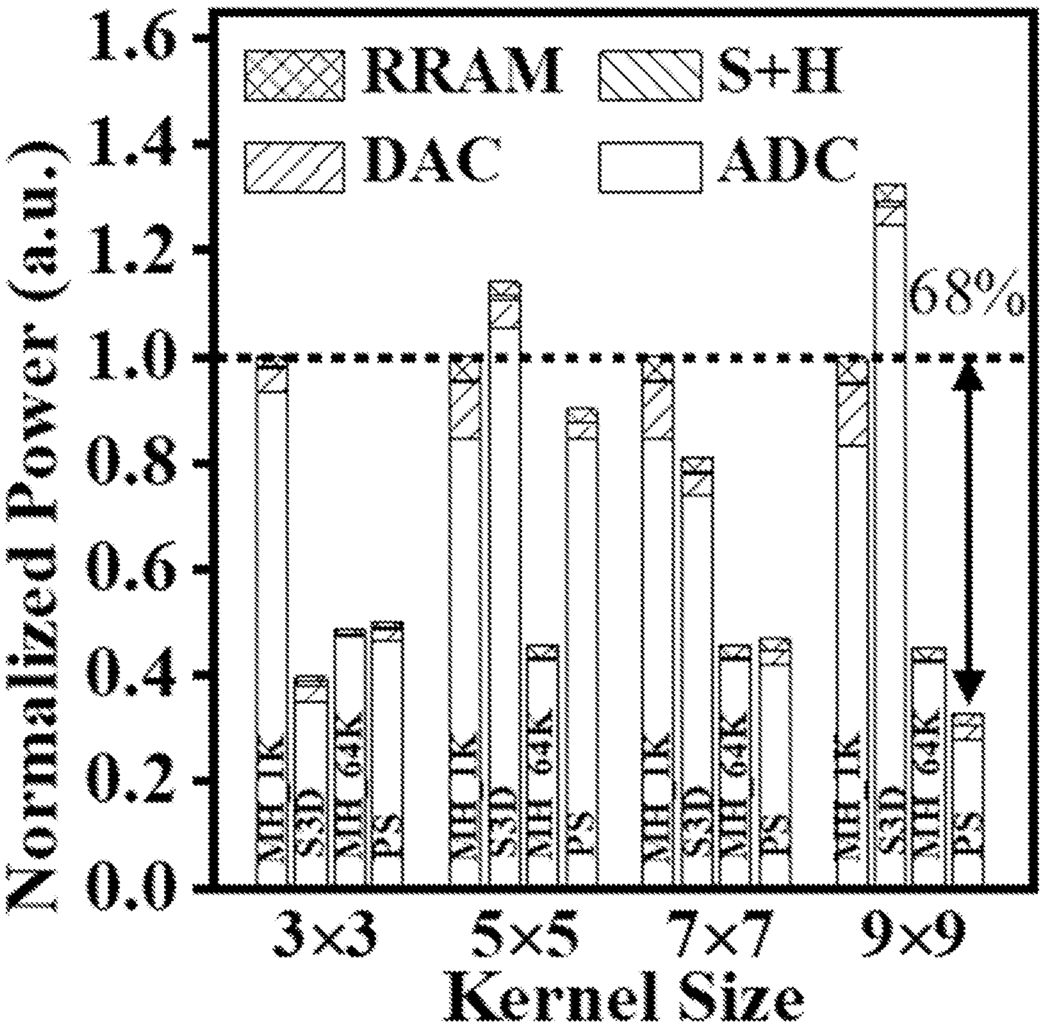
Figure 6F:
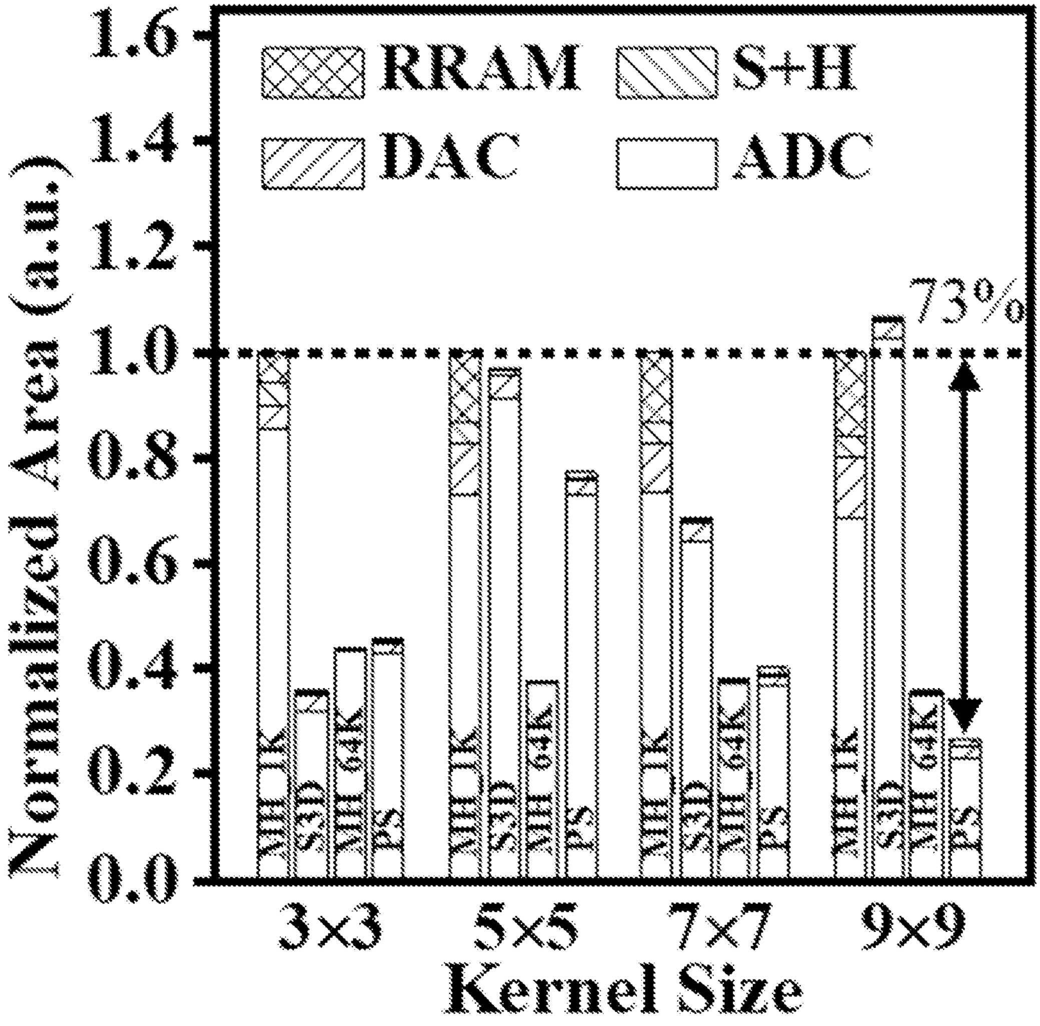
Figure 7:
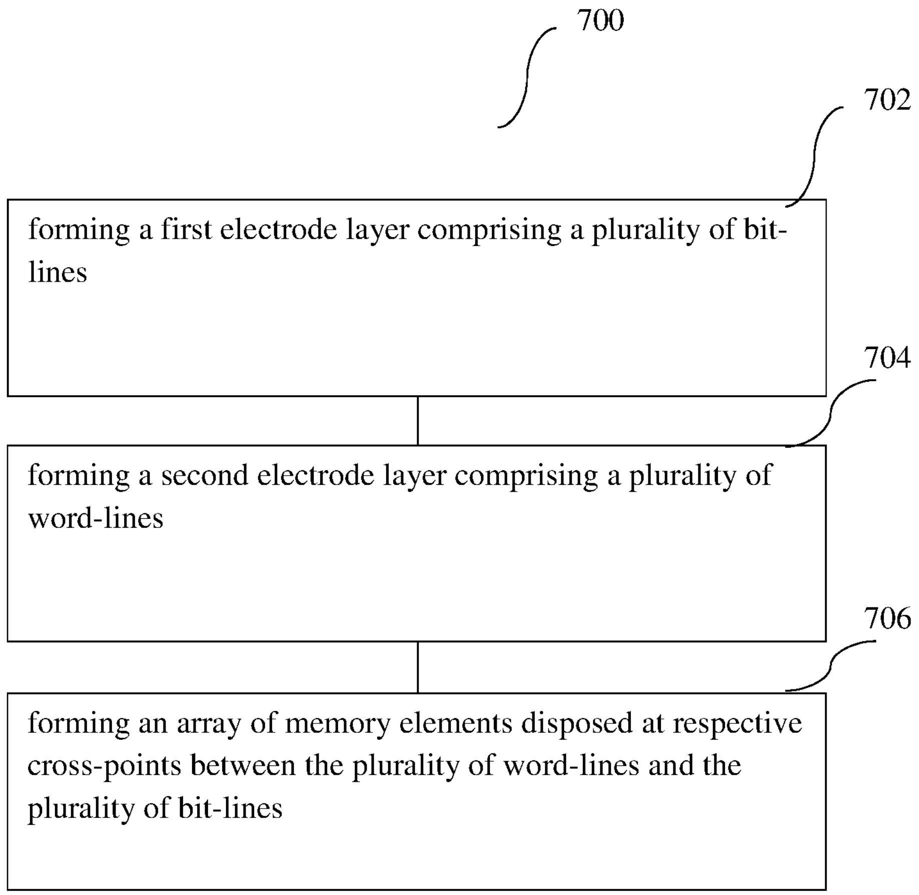
FIG. 7 shows a flowchart illustrating a method of fabricating a resistive random-access memory, RRAM, device for deep neural network, DNN, accelerators, according to an example embodiment.

For neural networks with ideal gaussian weight distribution, $\Delta_1$~$\Delta_3$& justifies neglecting the terms involving [B] elements. Also, one can eliminate the additional [B] terms in the calculation by making the device conductance at so to be OS. Here, a non-zero conductance was chosen to alleviate the high device variability that RRAM devices exhibit close to Highest Rank Selector (HRS). FIG. 5(*b*) shows the Modified National Institute of Standards and Technology database (MNIST) classification accuracy for different encoding schemes for a 3-layer DNN, i.e. a "subset" of the 4-layer DNN 500 depicted in FIG. 5(*a*), with the simplification outlined above. Considering the OE, system power, and 3-layer DNN accuracy, the S1_4_3 encoding scheme was chosen for further evaluations, according to an example embodiment. Using the above encoding scheme, the classification accuracy for MNIST database was evaluated using the python-matlab interface developed. From FIG. 5(*c*) one observes that the classification accuracy of the scheme for different CNNs (a 3-layer DNN and a 4-layer DNN) according to an example embodiment is comparable to software implementation.

Pipelined-Accelerator Design

To understand the effect of using the staircase array according to an example embodiment on accelerator power/area, the system parameters per array were evaluated as a function of Outputs/AS and the number of AS forming each array (#AS). The S1_4_3 scheme was considered for this analysis and the ADC resolutions were derived from FIG. 4(*d*) based on contributing RRAMs. In addition to the various analog and A/D interface circuits, the various digital components (Multipliers, adders, Input Registers, Output registers) required for processing data within these arrays according to an example embodiment were also considered. Multiple arrays according to an example embodiment are assumed to share the available ADCs, to enable the complete utilization of the various digital components. The ADC outputs are fed into the adders, the results of which are supplied to the multipliers. Any residual additions/subtractions are assumed to be executed in the tile top and not considered for analysis. The power and area of individual components are as given in the Tables 1 and 2, respectively. FIGS. 6(*a*) and (*c*) delineate that an increase in the outputs/AS and the #AS results in a steady decrease in power, according to example embodiments. This decrease is owing to increased utilization of available resources and plateaus after reaching a threshold value (PP). From FIG. 6(*b*), one observes an initial dip in the area followed by an exponential rise with an increase in outputs. Initially, for low inputs, the routing between consecutive AS remains constant while the sub-array area increases. However, this increase is lower than the dip in the area due to increased DAC sharing. Beyond outputs=Kernel_rows+1, any increase in outputs leads to an increased track requirement between consecutive AS and sub-arrays. Such an increase in track requirement leads to an exponential rise in the RRAM area, thus making it the dominant factor subsequently. As an increase in AS does not increase the routing/track requirements while increasing resource sharing, one observes a steady decline in the area with an increase in outputs in FIG. 6(*d*), according to example embodiment.

Furthermore, the performance of the system according to an example embodiment was compared with the staggered-3D array and Manhattan layout, as a function of kernel size for the S1_4_3 encoding scheme, in FIGS. 6(*e*) and (*f*). For a 28×28 input, the power and area consumed for the parallel convolution output generation was compared for the different layouts and kernel sizes. 64 kernel sets operating on the same images were considered to allow for the full utilization of the Manhattan array; the size, ADC resolution are dynamic for different layouts and determined based on the kernel (FIG. 4(*d*)). For the Manhattan layout, 3×3 kernels are processed on arrays of size 18×64, 5×5 on 50×64, 7×7 on 49×64, and 9×9 on 64×64.

Owing to I-R drop issues, the size of the Manhattan array was capped at 64×64 (~8% degradation). 9×9 kernels on arrays of size 10×20 (10 outputs/AS, 20 AS), 7×7 on 22×22, 5×5 on 24×24, and 3×3 on 26×26 are processed for the planar-staircase layout according to an example embodiment. For the staggered-3D version, one observes no increase in the I-R drop irrespective of the inputs and outputs, and hence a 256×256 array was considered (FIG. 3(*e*)) with a varying number of RRAM layers (capped at 9). The RRAMs processing the ceil and floor state matrix elements feed into the same integrator circuit in the staggered-3D layout. The power and area of various memory controller units are documented in the Table 1. In the FIGS. 6(*e*) and (*f*), MH_1K corresponds to the parameters for the Manhattan array processing a single kernel, while MH_64K is for the processing of 64. Since the Manhattan array parameters are dependent on the number of kernels, the worst and best cases were presented.

For the Staggered-3D array, the lower ADC resolution and input regeneration result in the lowestpower/area consumption among the considered layouts for a 3×3 kernel. But an increase in contributing RRAMs with kernel size increases the ADC resolution and accesses. Due to this, power consumption is higher for staggered-3D arrays for larger kernels. Though the RRAM footprint is lower with the 3D system, the peripheral requirement is higher (maximum of 9 contributing RRAMs per output as shown in FIG. 3(*e*)), and one observes higher savings with other layouts for large kernels. Multiple 5×5 kernels and the ceil/floor matrices can be simultaneously processed using a single array for the Manhattan layout. Such complete utilization lowers input regeneration and ADC usage to reduce power/area consumption compared to other structures for this case. But with an increase in kernel size, the kernel will need to be partitioned into multiple parts for processing using the Manhattan arrays. Such a split increases the ADC accesses and input regeneration, leading to increased power and area requirements. For a kernel size of 9×9, one observes area savings of ~73% and power reduction of 68% by the planar-staircase layout according to an example embodiment over the MH_1K case, while also resulting in significant savings over the MH_64K execution.

In addition, convolution of multiple kernels can be executed with the same input image using a single planar staircase array according to an example embodiment by storing the elements of different filters in different AS. Thus, the outputs of individual AS belong to the same kernel, while disparate AS outputs pertain to distinct kernels. Such execution requires rotating each kernel's columns across the sub-arrays of the AS according to an example embodiment based on the location of the inputs applied. Furthermore, when outputs/AS >Kernel_rows+1, input lines are shared between adjacent AS alone according to an example embodiment. Therefore, one can process kernels acting on multiple inputs, independent of whether they are contributing to the same output, by disregarding an AS in the middle, thereby separating the inputs. Using this, one can process $[M_3]$ and $[M_4]$ of numerous images using a single array to reduce the area and power requirement, according to an example embodiment. Such flexible processing enables complete utilization of the planar-staircase arrays according to an example embodiment and is not possible using the Manhattan layout.

Using the results from the previous analyses, the area and power efficiencies of the pipelined accelerator was evaluated for different configurations. The performance of the accelerator shown in FIG. 1(*d*) according to example embodiments is dependent on factors such as the number of IMs per tile (I), the number of individual arrays per IM (C), the number of available ADCs in an IM (A), the number of AS per array (AS), and the total outputs (O) per array. As ADCs and eDRAM contribute most to the accelerator power and area, it is preferred to optimize their requirement while enabling higher throughput. Based on the benchmarks, the size of the eDRAM buffer in a tile was established to be 64 KB. The outputs of the previous layer were stored in the current layer's eDRAM buffer. When new inputs necessary for the processing of kernels in this layer show up, it allows the current layer to proceed with its operations.

In the first cycle of the operation, the 16-bit inputs stored in the eDRAM are read out and sent to the PU for state matrix determination. The eDRAM and shared bus were designed to support this maximum bandwidth. A PU consists of a sorting unit to determine the peak, multipliers for fast division followed by comparators and combinatorial circuits. The state matrix elements are sent over the shared bus to the current layer's IM and stored in the input register (IR). The IR width was determined based on the unique inputs to an array and the number of arrays in each IM. While the number of DACs required by each array$=(x+r-1)\times(n+r_1-1+(0.5\times(r_1-1)\times(n-1))$, the number of unique inputs to each array$=(x+r-1)\times(n+r_1-1)$. Variable definition remains unchanged from what was described above in the array size evaluation section. The transfer of data from eDRAM to IR was performed within a 100 ns stage. After this, the IM sends the data to the respective arrays and performs in-memory computing during the next cycle. At the end of the 100 ns computation cycle, the outputs are latched in the SA circuits. In the next cycle, the ADCs convert these outputs to their 8-bit digital equivalents. The results of the ADCs are merged by the adder units (A), post which they are multiplied with the quantization step using 16-bit multipliers, together indicated as "A+M" in FIG. 1(*d*), and stored in the output register (OR) of the IM. In the 5th cycle, the final output stored in the OR is sent to the central OR units in the tile. These values may undergo another step of addition and merging with the central OR in the tile if the convolution is spread across multiple IMs. The contents of the central OR are sent to the ReLU unit (RU) in cycle 6. The ReLU unit consists of simple comparators that incur a relatively small area and power penalty. After processing the ReLU outputs using the max pool unit (MP) in cycle 7, the output feature map elements are written into eDRAM of the next layer in cycle 8. The mapping of layers to different tiles, IMs, and the resulting pipeline are determined off-line and loaded into control registers that drive finite state machines. For non-gaussian distributions with non-zero high resistance $s_{min}$, additional multipliers and adders are included to dedicated IMs processing $[M_3]$ and $[M_4]$ elements. These circuits calculate the residual value given in (10) within the IM while in-memory convolution is being executed. The residual values are added to the array outputs in subsequent cycles without disturbing the pipeline.

Furthermore, to deal with both the convolution layers and fully connected layers, the accelerator according to an example embodiment is divided into an equal number of Manhattan array tiles and Planar-staircase array tiles. It is noted that the staircase tiles are expected to only be optimally used for the execution of convolution operations. Since any CNN consists of both convolution and fully connected layers (compare FIG. 5(*a*)), both planar-staircase arrays and Manhattan arrays were used according to an example embodiment for best results. For the accelerator design, planar staircase arrays with 81 contributing RRAMs per output according to an example embodiment and Manhattan arrays of size 64×64 were considered. The digital overloads of different tiles are made equal by choosing the appropriate number of arrays per IM based on the array type. The area and power usage was estimated from the full layout of the system at the 40 nm node, including all peripheral and routing circuits needed to perform all operations. Power and area estimates for the determined optimum performance of the accelerator according to an example embodiment at the O120_AS12_I8_C8 (Planar-staircase tiles) configuration are provided in the Table 2.

TABLE 2

Power and Area Estimates

| Component | Value |
|---|---|
| Tech. node | 40 nm |
| Outputs | 120 |
| Unique Inputs | 360 |
| #Operations/Array | 19440 |
| #RRAM Devices | 81 × 120 |
| RRAM power | 0.16 mW |
| RRAM area | 45.489 $\mu mm^2$ |
| DAC resolution | 1-bit |
| #DAC accesses | 1152 |
| DAC power | 1.845 mW |
| DAC Area | 0.0001912 $mm^2$ |
| ADC resolution | 8-bit |
| #ADC accesses | 1 |
| ADC power | 2 mW |
| ADC area | 0.0012 $mm^2$ |
| SA accesses | 120 |
| SA Power | 9.31 μW |
| SA Area | 4.6875 $\mu mm^2$ |
| LPU + Routing Power | 2.321 mW |
| LPU + Routing Area | 0.008516 $mm^2$ |
| Frequency | 10 MHz |
| Total Power | 6.3353 mW |
| Total Area | 0.0099574 $mm^2$ |

Parameters per array for the O120_AS12_A8_I8_C8 configuration. Each chip consists of 84 such tiles.

It is noted that the power-efficiency of the technique according to an example embodiment can be further improved by efficient complementary metal-oxide semiconductor (CMOS) routing techniques. Also, while the above described optimizations focus on the layout of RRAM arrays and $M_2M$ execution within them, using an example embodiment in conjunction with other system-level optimizations such as buffer-size reduction, CMOS routing optimization could achieve higher area-efficiency & power-efficiency.

In an example embodiment a planar-staircase array with $Al_2O_3$ RRAM devices has been described. By applying voltage pulses to the staircase routed array's bottom electrodes for convolution execution, a concurrent shift in inputs is generated according to an example embodiment to eliminate matrix unfolding and regeneration. This results in a ~73% area and ~68% power reduction for a kernel size of 9×9, according to an example embodiment. The in-memory compute method according to an example embodiment described increases output accuracy and efficiently tackles device issues, and achieves 99.2% MNIST classification accuracy with a 4-bit Kernel resolution and 3-bit input feature map resolution, according to an example embodiment. Variation tolerant $M_2M$ according to an example embodiment is capable of processing signed matrix elements for kernels and input feature map as well, within a single array to reduce area overheads. Using the co-designed system, peak power and area efficiencies of 14.14 $TOPsW^{-1}$ and 8.995 $TOPsmm^{-2}$ were shown, respectively. Compared to state-of-the-art accelerators, an example embodiment improves power efficiency by 5.64× and area efficiency by 4.7×.

Embodiments of the present invention can have one or more of the following features and associated benefits/advantages:

Low-complexity, low-power staggered layout of the crossbar:

Bottom electrode of the proposed 2D-array is routed in a staggered fashion. Such a layout can efficiently execute convolutions between two matrices while eliminating input regeneration and unfolding. This, in turn, improves throughput while reducing power, area and redundancy. In addition, fabrication of a staggered-2D array is extremely easy compared to 3D array fabrication.

Pulse Application at Bottom Electrode:

Inputs are applied at the bottom electrodes of the device and collect the output current from the top electrodes. By using top electrodes for device programming and bottom electrode for data processing, both the programming time and processing time can be reduced.

Low-Complexity Mapping of Kernel Values to RRAM Conductance:

Current in-memory methods use complex algorithms to map kernel values to RRAM resistances in multiple arrays for parallel output generation. In an example embodiment, the mapping methodology is extremely simple and leads to reduction of pre-processing time High Throughput while Maintaining Low-Power and Low-Area:

Compared to current state-of-the-art accelerators using GPUs, ASIC-based systems and RRAM-based systems, a co-designed system according to an example embodiment shows higher throughput while using lower power and lower area. This is owing to the reduction in input regeneration and unfolding, which in turn reduces peripheral circuit requirement.

Scalability and Ease of Integration with Other Emerging Memories:

A co-designed system according to an example embodiment can be scaled based on application requirements and can be integrated with all other emerging memories such as Phase-Change Memories (PCMs), Oxide-RRAMs (Ox-RRAMs) etc In one embodiment, a memory device for deep neural network, DNN, accelerators, the memory device comprising:

a first electrode layer comprising a plurality of bit-lines;

a second electrode layer comprising a plurality of word-lines; and an array of memory elements disposed at respective cross-points between the plurality of word-lines and the plurality of bit-lines;

wherein at least a portion of the bit-lines are staggered such that a location of a cross-point between the bit-line and a first word-line is displaced along a direction of the word-lines compared to a cross-point between said bit-line and a second word-line adjacent the first word-line; or wherein at least a portion of the word-lines are staggered such that a location of a cross-point between the word-line and a first bit-line is displaced along a direction of the bit-lines compared to a cross-point between said word-line and a second bit-line adjacent the first bit-line.

Where at least a portion of the bit-lines are staggered, the array of memory elements may comprise a plurality of array-structures, ASs, each AS comprising a set of adjacent word-lines, wherein each AS comprises a plurality of sub-arrays, wherein each sub-array is configured to take inputs from a row of an input matrix and to have the elements of a row of a kernel applied in the DNN accelerator contributing to the output.

The memory device may be configured to have a digital to analog converter, DAC, circuit coupled to the bit-lines for inference processing. The memory device may comprise a connection layer separate from the first and second electrode layers for connecting intermediate bit-line inputs disposed between adjacent ones of the word-lines to the DAC circuit for inference processing.

The memory device may be configured to have an analog to digital converter and sense amplifier, ADC/SA, circuit coupled to the word-lines for inference processing.

Where at least a portion of the word-lines are staggered, the array of memory elements may comprise a plurality of array-structures, ASs, each AS comprising a set of adjacent bit-lines, wherein each AS comprises a plurality of sub-arrays, wherein each sub-array is configured to take inputs from a row of an input matrix and to have the elements of a row of a kernel applied in the DNN accelerator contributing to the output.

The memory device may be configured to have a digital to analog converter, DAC, circuit coupled to the word-lines for inference processing. The memory device may comprise a connection layer separate from the first and second electrode layers for connecting intermediate word-line inputs disposed between adjacent ones of the bit-lines to the DAC circuit for inference processing.

The memory device may be configured to have an analog to digital converter and sense amplifier, ADC/SA, circuit coupled to the bit-lines for inference processing.

Each memory element may comprise a switching layer sandwiched between the bottom and top electrode layers. The switching layer may comprise $Al_2O_3$, $SiO_2$, $HfO_2$, $MoS_2$, $TaO_x$, $TiO_2$, $ZrO_2$, ZnO, GeSbTe, Cu—$GeSe_x$ etc.

At least one of the bottom and top electrode layers may comprise an inert metal such as Platinum, Palladium, Gold, Silver, Copper, Tungsten etc.

At least one of the bottom and top electrode layers may comprise a reactive metal such as Titanium, TiN, TaN, Tantalum etc.

Figure 8:
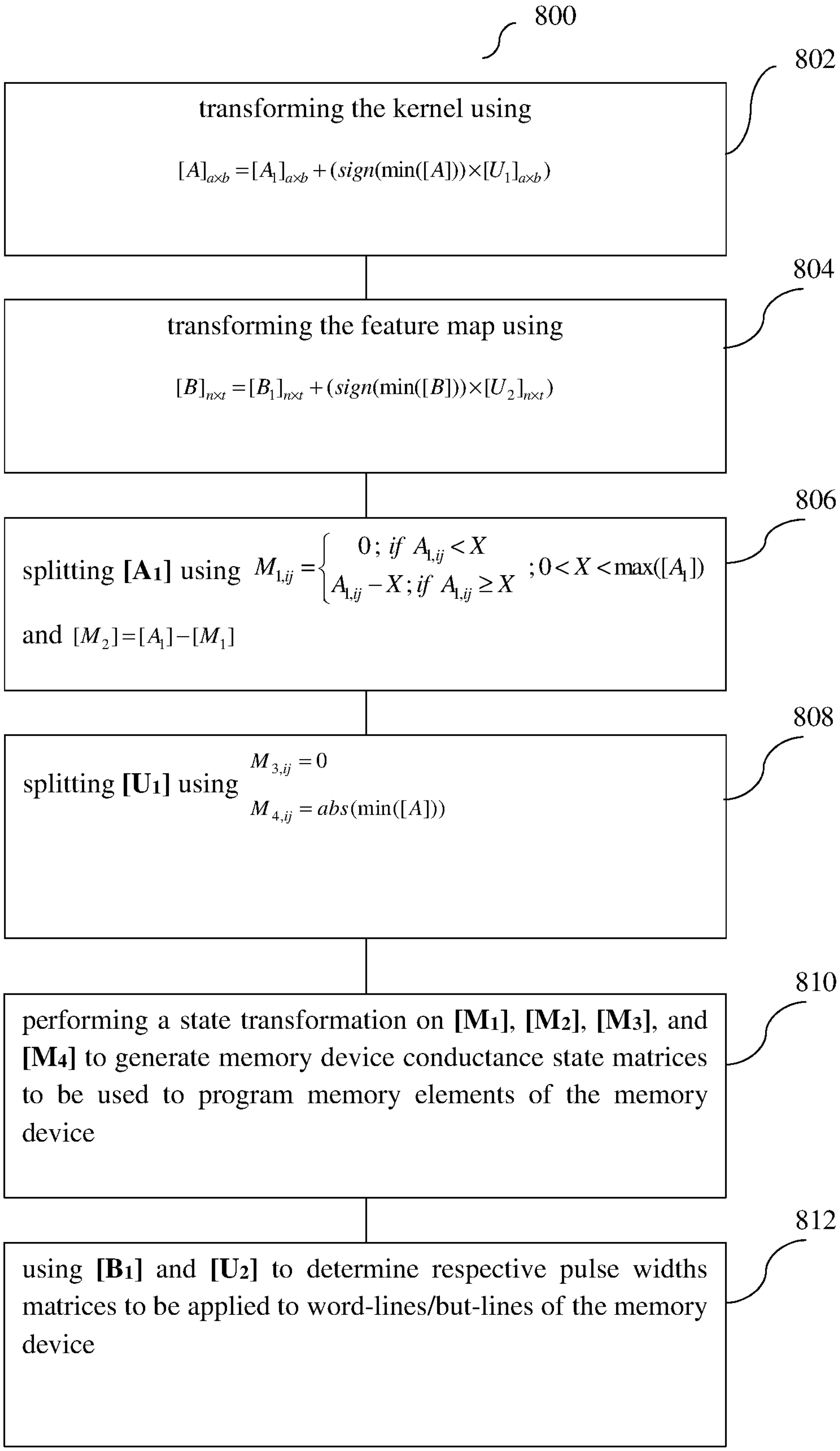
FIG. 8 shows a flowchart illustrating a method of convoluting a kernel [A] with an input feature map [B] in a memory device for a deep neural network, DNN, accelerator according to an example embodiment.

FIG. 8 shows a flowchart 700 illustrating a method of fabricating a memory device for deep neural network, DNN, accelerators, according to an example embodiment.

At step 702, a first electrode layer comprising a plurality of bit-lines is formed.

At step 704, a second electrode layer comprising a plurality of word-lines is formed.

At step 706, an array of memory elements disposed at respective cross-points between the plurality of word-lines and the plurality of bit-lines is formed, wherein at least a portion of the bit-lines are staggered such that a location of a first cross-point between the bit-line and a first word-line is displaced along a direction of the word-lines compared to the cross-point between said bit-line and a second word-line adjacent the first word-line; or wherein at least a portion of the word-lines are staggered such that a location of a cross-point between the word-line and a first bit-line is displaced along a direction of the bit-lines compared to a cross-point between said word-line and a second bit-line adjacent the first bit-line Where at least a portion of the bit-lines are staggered, the array of memory elements may comprise a plurality of array-structures, ASs, each AS comprising a set of adjacent word-lines, wherein each AS comprises a plurality of sub-arrays, wherein each sub-array is configured to take inputs from a row of an input matrix and to have the elements of a row of a kernel applied in the DNN accelerator contributing to the output.

The method may comprise configuring the memory device to have a digital to analog converter, DAC, circuit coupled to the bit-lines during inference processing. The method may comprise forming a connection layer separate from the first and second electrode layers for connecting intermediate bit-line inputs disposed between adjacent ones of the word-lines to the DAC circuit during inference processing.

The method may comprise configuring the memory device to have an analog to digital converter and sense amplifier, ADC/SA, circuit coupled to the word-lines during inference processing.

Where at least a portion of the bit-lines are staggered, the array of memory elements may comprise a plurality of array-structures, ASs, each AS comprising a set of adjacent bit-lines, wherein each AS comprises a plurality of sub-arrays, wherein each sub-array is configured to take inputs from a row of an input matrix and to have the elements of a row of a kernel applied in the DNN accelerator contributing to the output.

The method may comprise configuring the memory device to have a digital to analog converter, DAC, circuit coupled to the word-lines during inference processing. The method may comprise forming a connection layer separate from the first and second electrode layers for connecting intermediate word-line inputs disposed between adjacent ones of the bit-lines to the DAC circuit during inference processing.

The method may comprise configuring the memory device to have an analog to digital converter and sense amplifier, ADC/SA, circuit coupled to the bit-lines during inference processing.

Each memory element may comprise a switching layer sandwiched between the bottom and top electrode layers. The switching layer may comprise $Al_2O_3$, $SiO_2$, $HfO_2$, $MoS_2$, $TaO_x$, $TiO_2$, $ZrO_2$, ZnO, GeSbTe, Cu—$GeSe_x$ etc.

At least one of the bottom and top electrode layers may comprise an inert metal such as Platinum, Palladium, Gold, Silver, Copper, Tungsten etc.

At least one of the bottom and top electrode layers may comprise a reactive metal such as Titanium, TiN, TaN, Tantalum etc.

FIG. 8 shows a flowchart 800 illustrating a method of convoluting a kernel [A] with an input feature map [B] in a memory device for a deep neural network, DNN, accelerator, according to an example embodiment.

At step 802, the kernel is transformed using $[A]_{a\times b}=[A_1]_{a\times b}+(\text{sign}(\min([A]))\times[U_1]_{a\times b})$ At step 804, the feature map is transformed using $[B]_{n\times t}=[B_1]_{n\times t}+(\text{sign}(\min([B]))\times[U_2]_{n\times t})$ At step 806, $[A_1]$ is split using $$M_{1,ij} = \begin{cases} 0; \text{ if } A_{1,ij} < X \\ A_{1,ij} - X; \text{ if } A_{1,ij} \geq X \end{cases}; 0 < X < \max([A_1]) \text{ and } [M_2] = [A_1] - [M_1].$$

At step 808, $[U_1]$ is split using $$M_{3,ij} = 0$$

$$M_{4,ij} = \text{abs}(\min([A])).$$

At step 810, a state transformation is performed on $[M_1]$, $[M_2]$, $[M_3]$, and $[M_4]$ to generate memory device conductance state matrices to be used to program memory elements of the memory device.

At step 812, $[B_1]$ and $[U_2]$ are used to determine respective pulse widths matrices to be applied to word-lines/bit-lines of the memory device.

Performing a state transformation on $[M_1]$, $[M_2]$, $[M_3]$, and $[M_4]$ to generate the memory device conductance state matrices may be based on a selected quantization step of the DNN accelerator. Using $[B_1]$ and $[U_2]$ to determine respective pulse widths matrices may be based on the selected quantization step of the DNN accelerator.

The method may comprise splitting each of $[M_1]$ and $[M_2]$ using equations equivalent to $$M_{1,ij} = \begin{cases} 0; \text{ if } A_{1,ij} < X \\ A_{1,ij} - X; \text{ if } A_{1,ij} \geq X \end{cases}; 0 < X < \max([A_1]) \text{ and } [M_2] = [A_1] - [M_1];$$

and performing a state transformation on the resultant split matrices to generate additional memory device conductance state matrices to be used to program memory elements of the memory device, for increasing an accuracy of the DNN accelerator.

In one embodiment, a memory device for a deep neural network, DNN, accelerator is provided, configured for executing the method of method of convoluting a kernel [A] with an input feature map [B] in a memory device for a deep neural network, DNN, accelerator according to any one of the above embodiments.

In one embodiment, a deep neural network, DNN, accelerator is provided, comprising a memory device according to any one of the above embodiments.

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the system include: microcontrollers with memory (such as electronically erasable programmable read only memory (EEPROM)), embedded microprocessors, firmware, software, etc. Furthermore, aspects of the system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The various functions or processes disclosed herein may be described as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. When received into any of a variety of circuitry (e.g. a computer), such data and/or instruction may be processed by a processing entity (e.g., one or more processors).

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive. Also, the invention includes any combination of features described for different embodiments, including in the summary section, even if the feature or combination of features is not explicitly specified in the claims or the detailed description of the present embodiments.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

We claim:

1. A memory device for deep neural network, DNN, accelerators, the memory device comprising:

a first electrode layer comprising a plurality of bit-lines formed from a first material;

a second electrode layer comprising a plurality of word-lines formed from a second material; and an array of memory elements disposed at respective cross-points between the plurality of word-lines and the plurality of bit-lines, wherein each memory element comprises a switching layer formed from a third material sandwiched between the first and second electrode layers;

wherein at least a portion of the bit-lines are staggered such that a location of a memory element at a cross-point between the bit-line and a first word-line is displaced along a direction of the word-lines compared to a memory element at a cross-point between said bit-line and a second word-line adjacent the first word-line; or wherein at least a portion of the word-lines are staggered such that a location of memory element at a cross-point between the word-line and a first bit-line is displaced along a direction of the bit-lines compared to a memory element at a cross-point between said word-line and a second bit-line adjacent the first bit-line.

2. The memory device of claim 1, wherein at least a portion of the bit-lines are staggered and the array of memory elements comprises a plurality of array-structures, ASs, each AS comprising a set of adjacent word-lines, wherein each AS comprises a plurality of sub-arrays, wherein each sub-array is configured to take inputs from a row of an input matrix and to have the elements of a row of a kernel applied in the DNN accelerator contributing to the output.

3. The memory device of claim 1, configured to have a digital to analog converter, DAC, circuit coupled to the bit-lines for inference processing, and preferably comprising a connection layer separate from the first and second electrode layers for connecting intermediate bit-line inputs disposed between adjacent ones of the word-lines to the DAC circuit for inference processing.

4. The memory device of claim 1, configured to have an analog to digital converter and sense amplifier, ADC/SA, circuit coupled to the word-lines for inference processing.

5. The memory device of claim 1, wherein at least a portion of the word-lines are staggered and the array of memory elements comprises a plurality of array-structures, ASs, each AS comprising a set of adjacent bit-lines, wherein each AS comprises a plurality of sub-arrays, wherein each sub-array is configured to take inputs from a row of an input matrix and to have the elements of a row of a kernel applied in the DNN accelerator contributing to the output.

6. The memory device of claim 1, configured to have a digital to analog converter, DAC, circuit coupled to the word-lines for inference processing, and preferably comprising a connection layer separate from the first and second electrode layers for connecting intermediate word-line inputs disposed between adjacent ones of the bit-lines to the DAC circuit for inference processing.

7. The memory device of claim 1, configured to have an analog to digital converter and sense amplifier, ADC/SA, circuit coupled to the bit-lines for inference processing.

8. The memory device of claim 1, wherein the switching layer comprises $Al_2O_3$, $SiO_2$, $HfO_2$, $MoS_2$, $TaO_x$, $TiO_2$, $ZrO_2$, ZnO, GeSbTe, Cu-$GeSe_x$ etc, preferably wherein at least one of the first and second electrode layers comprises an inert metal such as Platinum, Palladium, Gold, Silver, Copper, Tungsten etc, preferably wherein at least one of the first and second electrode layers comprises a reactive metal such as Titanium, TiN, TaN, Tantalum etc.

9. A method of fabricating a memory device for deep neural network, DNN, accelerators, the method comprising the steps of:

forming a first electrode layer comprising a plurality of bit-lines;

forming a second electrode layer comprising a plurality of word-lines; and forming an array of memory elements disposed at respective cross-points between the plurality of word-lines and the plurality of bit-lines;

wherein at least a portion of the bit-lines are staggered such that a location of a memory element at a cross-point between the bit-line and a first word-line is displaced along a direction of the word-lines compared to a memory element at a cross-point between said bit-line and a second word-line adjacent the first word-line; or wherein at least a portion of the word-lines are staggered such that a location of memory element at a cross-point between the word-line and a first bit-line is displaced along a direction of the bit-lines compared to a memory element at a cross-point between said word-line and a second bit-line adjacent the first bit-line.

10. The method of claim 9, wherein at least a portion of the bit-lines are staggered and the array of memory elements comprises a plurality of array-structures, ASs, each AS comprising a set of adjacent word-lines, wherein each AS comprises a plurality of sub-arrays, wherein each sub-array is configured to take inputs from a row of an input matrix and to have the elements of a row of a kernel applied in the DNN accelerator contributing to the output.

11. The method of claim 9, comprising configuring the memory device to have a digital to analog converter, DAC, circuit coupled to the bit-lines during inference processing, and optionally comprising forming a connection layer separate from the first and second electrode layers for connecting intermediate bit-line inputs disposed between adjacent ones of the word-lines to the DAC circuit during inference processing.

12. The method of claim 9, comprising configuring the memory device to have an analog to digital converter and sense amplifier, ADC/SA, circuit coupled to the word-lines during inference processing.

13. The method of claim 9, wherein at least a portion of the bit-lines are staggered and the array of memory elements comprises a plurality of array-structures, ASs, each AS comprising a set of adjacent bit-lines, wherein each AS comprises a plurality of sub-arrays, wherein each sub-array is configured to take inputs from a row of an input matrix and to have the elements of a row of a kernel applied in the DNN accelerator contributing to the output.

14. The method of claim 9, comprising configuring the memory device to have a digital to analog converter, DAC, circuit coupled to the word-lines during inference processing, and optionally comprising forming a connection layer separate from the first and second electrode layers for connecting intermediate word-line inputs disposed between adjacent ones of the bit-lines to the DAC circuit during inference processing.

15. The method of claim 9, comprising configuring the memory device to have an analog to digital converter and sense amplifier, ADC/SA, circuit coupled to the bit-lines during inference processing.

16. The method of claim 9, wherein each memory element comprises a switching layer wherein the switching layer comprises $Al_2O_3$, $SiO_2$, $HfO_2$, $MoS_2$, $TaO_x$, $TiO_2$, $ZrO_2$, ZnO, GeSbTe, Cu-$GeSe_x$ etc, preferably wherein at least one of the first and second electrode layers comprises an inert metal such as Platinum, Palladium, Gold, Silver, Copper, Tungsten etc, preferably wherein at least one of the first and second electrode layers comprises a reactive metal such as Titanium, TiN, TaN, Tantalum etc.

17. A method of convoluting a kernel [A] with an input feature map [B] in a memory device for a deep neural network, DNN, accelerator, comprising the steps of:

transforming the kernel using $[A]_{a\times b}=[A_1]_{a\times b}+(\text{sign}(\min([A]))\times[U_1]_{a\times b})$;

transforming the feature map using $[B]_{n\times t}=[B_1]_{n\times t}+(\text{sign}(\min([B])\times[U_2]_{n\times t})$;

splitting $[A_1]$ using $$M_{1,ij} = \begin{cases} 0; \text{ if } A_{1,ij} < X \\ A_{1,ij} - X; \text{ if } A_{1,ij} \geq X \end{cases}; 0 < X < \max([A_1]) \text{ and } [M_2] = [A_1] - [M_1];$$

splitting $[U_1]$ using $$M_{3,ij} = 0$$

$$M_{4,ij} = \text{abs}(\min([A]));$$

performing a state transformation on $[M_1]$, $[M_2]$, $[M_3]$, and $[M_4]$ to generate memory device conductance state matrices to be used to program memory elements of the memory device; and using $[B_1]$ and $[U_2]$ to determine respective pulse widths matrices to be applied to word-lines/bit-lines of the memory device.

18. The method of claim 17, wherein performing a state transformation on $[M_1]$, $[M_2]$, $[M_3]$, and $[M_4]$ to generate the memory device conductance state matrices is based on a selected quantization step of the DNN accelerator.

19. The method of claim 18, wherein using $[B_1]$ and $[U_2]$ to determine respective pulse widths matrices is based on the selected quantization step of the DNN accelerator.

20. The method of claim 19, comprising splitting each of $[M_1]$ and $[M_2]$ using equations equivalent to $$M_{1,ij} = \begin{cases} 0; \text{ if } A_{1,ij} < X \\ A_{1,ij} - X; \text{ if } A_{1,ij} \geq X \end{cases}; 0 < X < \max([A_1]) \text{ and } [M_2] = [A_1] - [M_1];$$

and performing a state transformation on the resultant split matrices to generate additional memory device conductance state matrices to be used to program memory elements of the memory device, for increasing an accuracy of the DNN accelerator.

* * * * *